United States Patent
Choi et al.

(10) Patent No.: US 12,302,734 B2
(45) Date of Patent: May 13, 2025

(54) ELECTRONIC DEVICE

(71) Applicant: Samsung Display Co., Ltd., Yongin-si (KR)

(72) Inventors: Kyung Hyun Choi, Seoul (KR); Moosoon Ko, Seoul (KR); Jingoo Jung, Seongnam-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 454 days.

(21) Appl. No.: 17/691,535

(22) Filed: Mar. 10, 2022

(65) Prior Publication Data

US 2022/0293689 A1    Sep. 15, 2022

(30) Foreign Application Priority Data

Mar. 10, 2021 (KR) .......................... 10-2021-0031636
May 4, 2021 (KR) .......................... 10-2021-0057972

(51) Int. Cl.
| | |
|---|---|
| H10K 59/40 | (2023.01) |
| H01L 29/49 | (2006.01) |
| H01L 29/786 | (2006.01) |
| H10K 50/844 | (2023.01) |
| H10K 50/86 | (2023.01) |

(Continued)

(52) U.S. Cl.
CPC .......... *H10K 59/40* (2023.02); *H01L 29/4908* (2013.01); *H01L 29/78633* (2013.01); *H10K 50/844* (2023.02); *H10K 50/865* (2023.02); *H10K 59/122* (2023.02); *H10K 59/131* (2023.02); *H10K 59/353* (2023.02); *H10K 59/38* (2023.02); *H01L 2924/12044* (2013.01)

(58) Field of Classification Search
CPC .... H10K 59/40; H10K 59/353; H10K 59/131; H10K 59/122; H10K 59/38; H10K 50/865; H10K 50/844; H01L 29/4908; H01L 29/78633; H01L 2924/12044
See application file for complete search history.

(56) References Cited

U.S. PATENT DOCUMENTS 9,349,780 B2    5/2016  Kim et al.
11,910,687 B2 *  2/2024  Lee ..................... H10K 59/352
(Continued)

FOREIGN PATENT DOCUMENTS

| KR | 102010789 B1 | 10/2019 |
|---|---|---|
| KR | 1020200039866 A | 4/2020 |

(Continued)

*Primary Examiner* — Alonzo Chambliss
(74) *Attorney, Agent, or Firm* — CANTOR COLBURN LLP

(57) ABSTRACT

An electronic device includes a display panel in which a first area including an electronic module, a display area, a line area and a transmission area, and a second area adjacent to the first area are defined, where the display panel includes a base layer, a light blocking layer disposed on the base layer, a plurality of insulating layers disposed on the base layer, a first pixel disposed in the first area, and a second pixel disposed in the second area, and an input sensor disposed on the display panel, where the input sensor includes sensing insulating layers. The first area has a higher light transmittance than the second area, the light blocking layer overlaps the display area and the line area, and the light blocking layer does not overlap the transmission area.

19 Claims, 13 Drawing Sheets

(51) Int. Cl.
    *H10K 59/122*    (2023.01)
    *H10K 59/131*    (2023.01)
    *H10K 59/35*    (2023.01)
    *H10K 59/38*    (2023.01)

(56) References Cited

U.S. PATENT DOCUMENTS

| | | |
|---|---|---|
| 2020/0295300 A1 | 9/2020 | Chung et al. |
| 2020/0357871 A1 | 11/2020 | Chung et al. |
| 2021/0335955 A1 | 10/2021 | Son et al. |
| 2021/0359047 A1* | 11/2021 | Yoon .................... H10K 59/122 |
| 2022/0005900 A1 | 1/2022 | You et al. |
| 2022/0020835 A1 | 1/2022 | Choi et al. |
| 2022/0415972 A1* | 12/2022 | Choi .................... H10K 59/122 |
| 2023/0062159 A1* | 3/2023 | Cho .................... H10K 50/865 |
| 2023/0065135 A1* | 3/2023 | Kim .................... H10K 50/865 |

FOREIGN PATENT DOCUMENTS

| | | |
|---|---|---|
| KR | 1020200109435 A | 9/2020 |
| KR | 1020210130893 A | 11/2021 |
| KR | 1020220003693 A | 1/2022 |
| KR | 1020220008992 A | 1/2022 |

\* cited by examiner

ELECTRONIC DEVICE

This application claims priority to Korean Patent Applications No. 10-2021-0031636, filed on Mar. 10, 2021, and Korean Patent Applications No. 10-2021-0057972, filed on May 4, 2021, and all the benefits accruing therefrom under 35 U.S.C. § 119, the contents of which in their entireties are herein incorporated by reference.

BACKGROUND

1. Field

The disclosure relates to an electronic device. More particularly, the disclosure relates to an electronic device including an area with improved transmittance.

2. Description of the Related Art

An electronic device is typically activated in response to electrical signals. The electronic device may include devices configured by various electronic components, such as a display unit for displaying an image or a sensing unit for sensing an external input. The electronic components are electrically connected to each other by signal lines arranged in various ways.

SUMMARY

The disclosure provides an electronic device including an area with improved transmittance in an active area.

An embodiment of the invention provide an electronic device including a display panel and an input sensor. In such an embodiment, a first area including a display area, a line area and a transmission area, and a second area adjacent to the first area are defined in the display panel, and the display panel includes a base layer, a barrier layer disposed on the base layer, a light blocking layer disposed on the barrier layer, a plurality of insulating layers disposed on the base layer, a first pixel disposed in the first area, and a second pixel disposed in the second area. In such an embodiment, the input sensor is disposed on the display panel and includes sensing insulating layers. The first area has a higher light transmittance than the second area, the light blocking layer overlaps the display area and the line area, and the light blocking layer does not overlap the transmission area.

In an embodiment, the transmission area may be surrounded by the display area and the line area when viewed in a plan view.

In an embodiment, the display panel may include a circuit element layer including the base layer, the barrier layer, the light blocking layer, a buffer layer disposed on the barrier layer, the insulating layers, and transistors disposed between the insulating layers, a display element layer including a light emitting diode including a first electrode connected to the transistors, a second electrode, and a light emitting layer disposed between the first electrode and the second electrode, and a pixel definition layer provided with an opening defined therethrough to expose at least a portion of the first electrode, and a thin film encapsulation layer covering the display element layer, where the thin film encapsulation layer may include a first inorganic layer, a second inorganic layer, and an organic layer disposed between the first inorganic layer and the second inorganic layer.

In an embodiment, the insulating layers may include first, second, third, fourth, fifth, sixth, and seventh insulating layers. In such an embodiment, one transistor among the transistors may include a first semiconductor pattern disposed on the buffer layer, covered by the first insulating layer, where the first semiconductor pattern may include a first active including a polysilicon, a first gate disposed on the first insulating layer, covered by the second insulating layer, and overlapping the first active, and an upper electrode disposed on the second insulating layer, covered by the third insulating layer, and overlapping the first gate. In such an embodiment, another transistor among the first to seventh transistors may include a second semiconductor pattern disposed on the third insulating layer, and covered by the fourth insulating layer, where the second semiconductor pattern may include a second active including a metal oxide, and a second gate disposed on the fourth insulating layer, covered by the fifth insulating layer, and overlapping the second active.

In an embodiment, the electronic device may further include a first connection electrode disposed on the fifth insulating layer, covered by the sixth insulating layer, and connected to the transistors via a first contact hole defined through the first to fifth insulating layers and a second connection electrode disposed on the sixth insulating layer, covered by the seventh insulating layer, and connecting the first electrode to the first connection electrode via a second contact hole defined through the sixth insulating layer.

In an embodiment, the line area may include a first gate line disposed on the first insulating layer and branching off from the first gate, an upper electrode line disposed on the second insulating layer and branching off from the upper electrode, a second gate line disposed on the fourth insulating layer and branching off from the second gate, a first connection electrode line disposed on the fifth insulating layer and branching off from the first connection electrode, and a second connection electrode line disposed on the sixth insulating layer and branching off from the second connection electrode.

In an embodiment, the transmission area may overlap the base layer, the barrier layer, the buffer layer, the sixth insulating layer, the first inorganic layer, the organic layer, and the second inorganic layer.

In an embodiment, the electronic device may further include a protective pattern adjacent to the transmission area of the display area, and disposed on at least one selected from the sixth insulating layer and the seventh insulating layer, where the protective pattern may include a metal.

In an embodiment, the electronic device may further include a black matrix overlapping the pixel definition layer and disposed on the input sensor, a color filter overlapping the light emitting layer, and an overcoat layer covering the color filter.

In an embodiment, the sensing insulating layers may overlap the first area and the second area.

In an embodiment, a portion of the overcoat layer, which overlaps the transmission area, may be in contact with one of the sensing insulating layers.

In an embodiment, a portion of an upper surface of the black matrix, which is adjacent to the transmission area, may be covered by the overcoat layer.

In an embodiment, the pixel definition layer may have a black color.

In an embodiment, the electronic device may further include an additional light blocking layer disposed in the second area.

In an embodiment, the light blocking layer may be provided with a plurality of holes defined therethrough to expose a portion of the barrier layer.

In an embodiment, each of the first pixel and the second pixel may include a plurality of sub-pixels which emits lights having first, second, and third colors, respectively, and an arrangement of the sub-pixels of the first pixel may be different from an arrangement of the sub-pixels of the second pixel.

In an embodiment, each of the first pixel and the second pixel may include a plurality of sub-pixels which emits lights having first, second, and third colors, respectively, and an area of the sub-pixels of a same color may be greater in the first pixel than in the second pixel.

In an embodiment, the transmission area may be surrounded by the line area and the display area.

In an embodiment, the transmission area may have a cross shape.

In an embodiment, the electronic device may further include an electronic module overlapping the first area and disposed under the display panel, and the electronic module may include at least one selected from an audio output module, a light emitting module, a light receiving module, and a camera module.

According to embodiments of the invention, the electronic device provides the display module with improved transmittance. Thus, when the electronic module is disposed in the active area, a performance of the electronic module of the electronic device is improved.

BRIEF DESCRIPTION OF THE DRAWINGS

The above and other features of the disclosure will become more apparent by describing in further detail embodiments thereof with reference to the accompanying drawings, in which.

DETAILED DESCRIPTION

Figure 1:
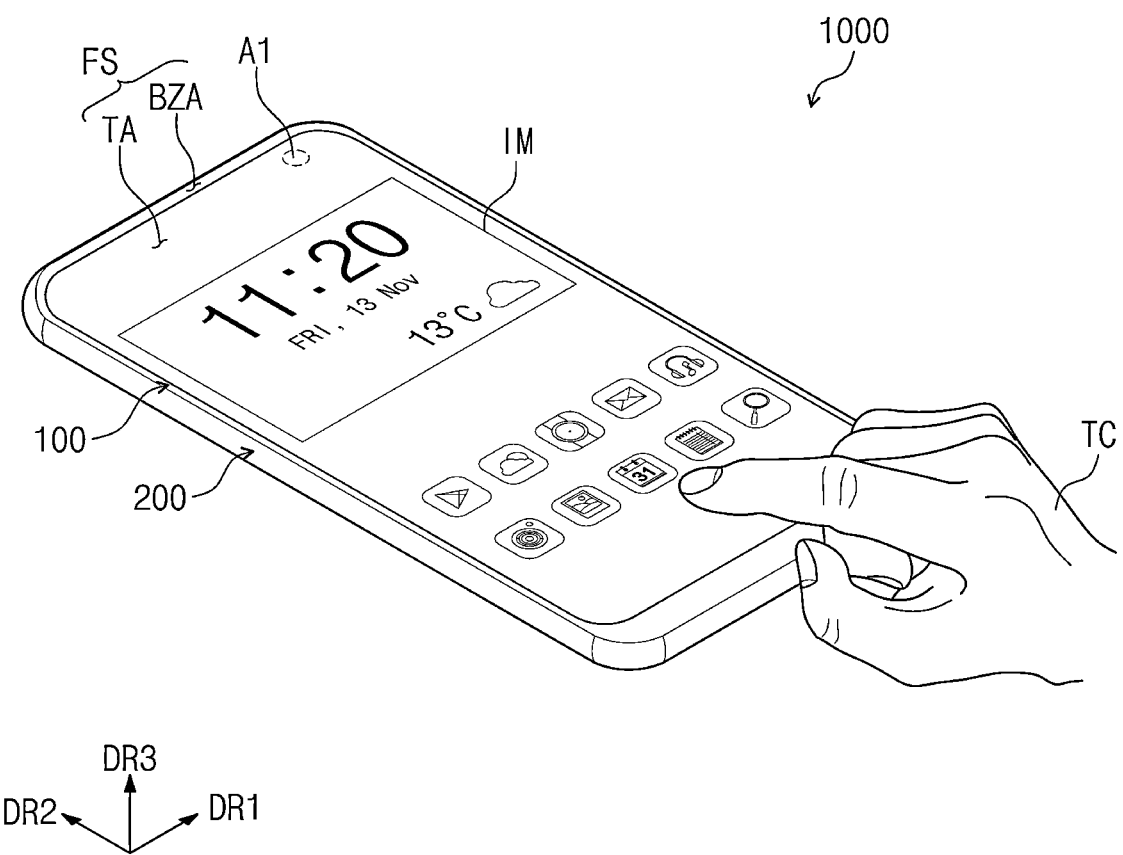
FIG. 1 is a perspective view showing an electronic device according to an embodiment of the disclosure.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

It will be understood that when an element is referred to as being "on" another element, it can be directly on the other element or intervening elements may be present therebetween. In contrast, when an element is referred to as being "directly on" another element, there are no intervening elements present.

In the disclosure, it will be understood that when an element or layer is referred to as being "on", "connected to" or "coupled to" another element or layer, it can be directly on, connected or coupled to the other element or layer or intervening elements or layers may be present.

Like numerals refer to like elements throughout. In the drawings, the thickness, ratio, and dimension of components are exaggerated for effective description of the technical content. The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms including technical and scientific terms used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the disclosure will be described in detail with reference to the accompanying drawings.

Figure 2A:
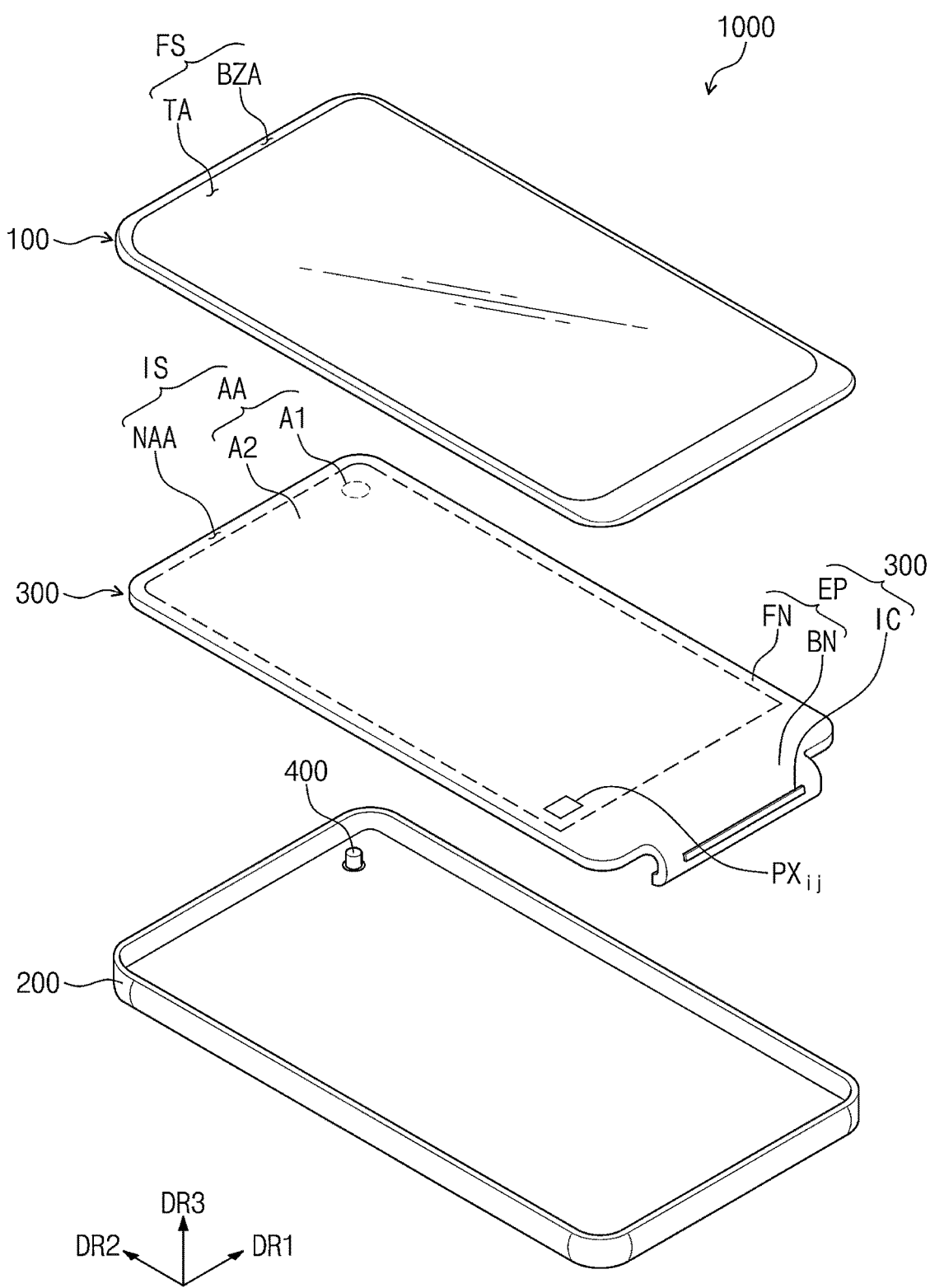
FIG. 2A is an exploded perspective view showing an electronic device according to an embodiment of the disclosure.
Figure 2B:
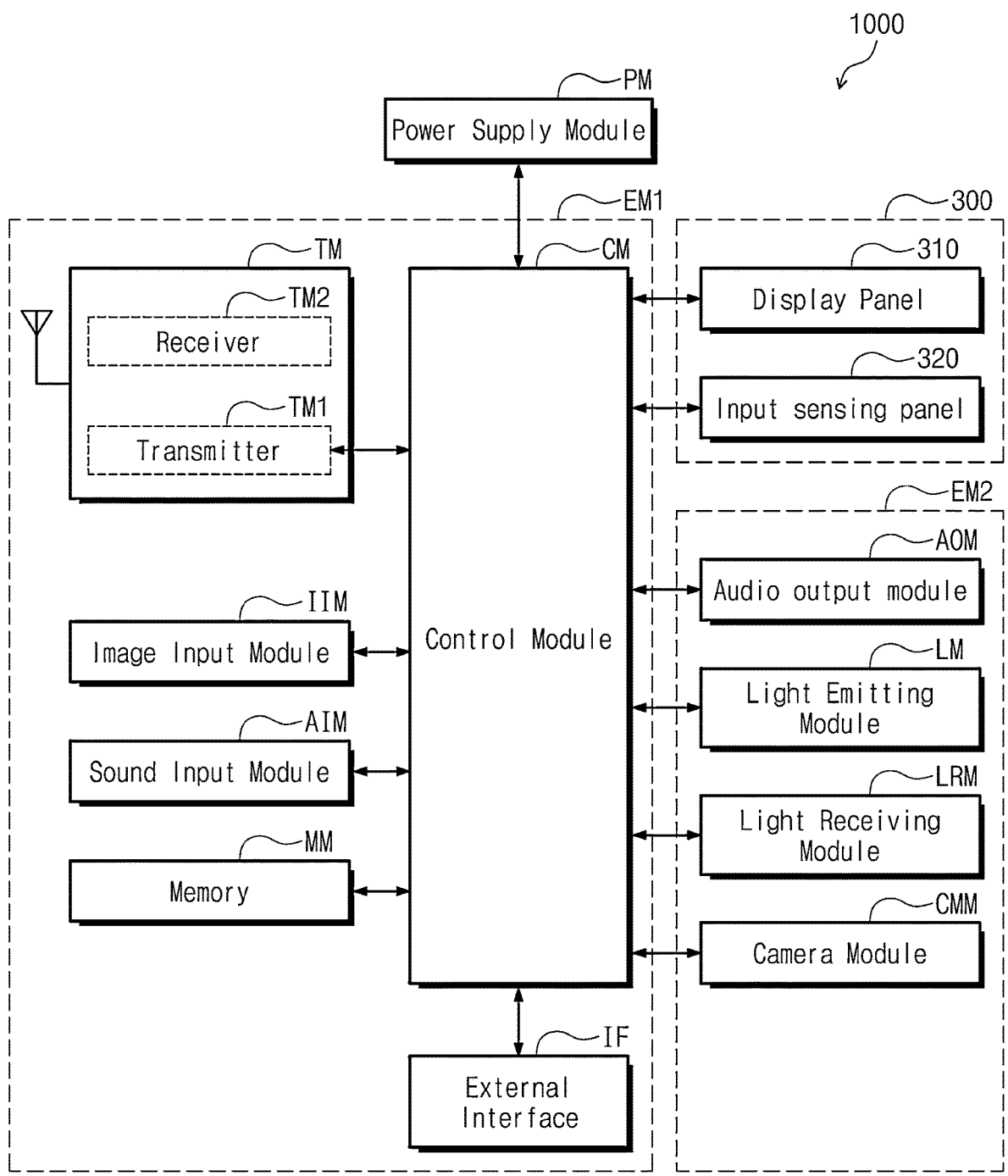
FIG. 2B is a block diagram showing an electronic device according to an embodiment of the disclosure.
Figure 3:
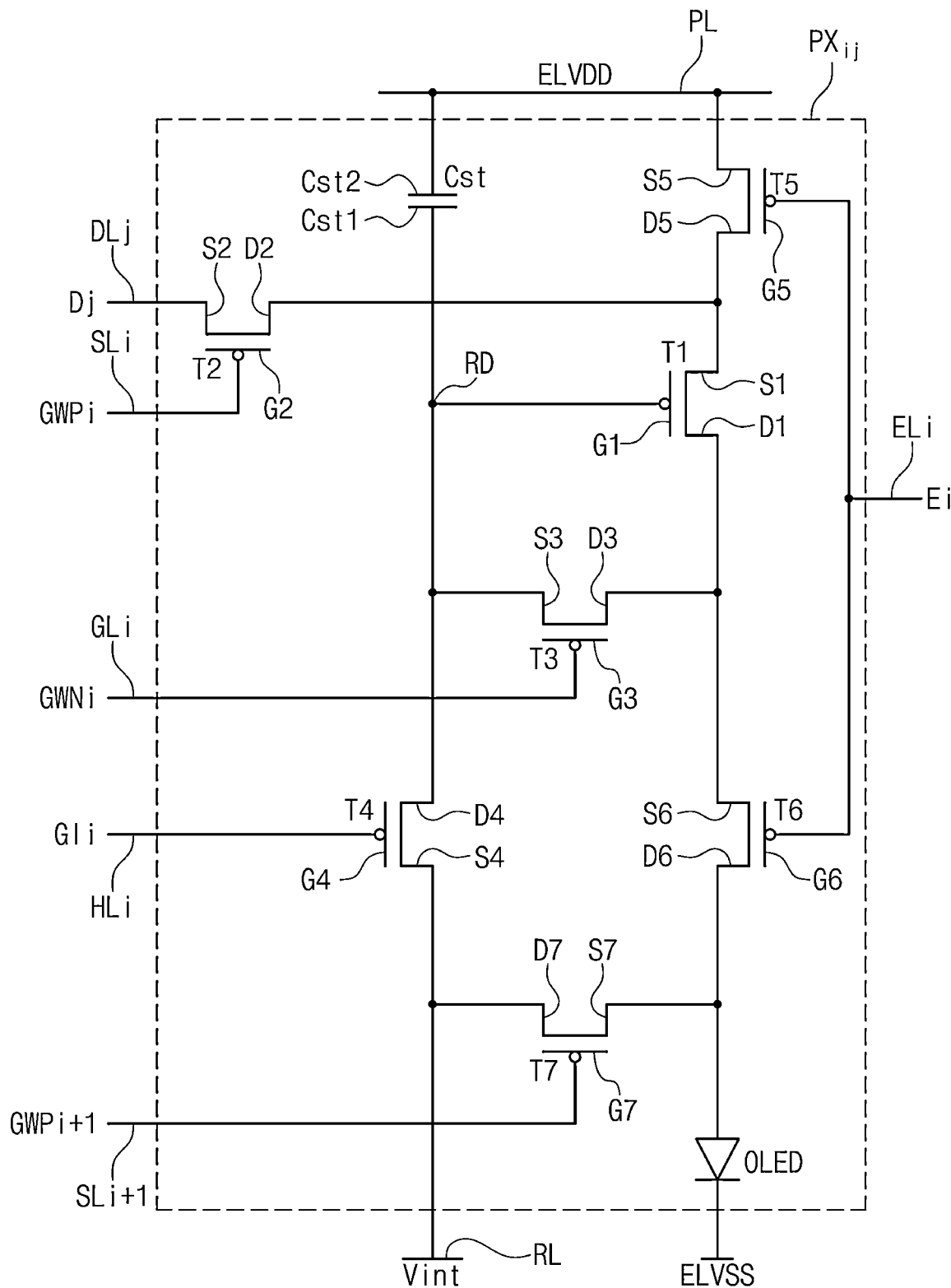
FIG. 3 is an equivalent circuit diagram showing a pixel according to an embodiment of the disclosure.

FIG. 1 is a perspective view showing an electronic device 1000 according to an embodiment of the disclosure. FIG. 2A is an exploded perspective view showing the electronic device 1000 according to an embodiment of the disclosure. FIG. 2B is a block diagram showing the electronic device 1000 according to an embodiment of the disclosure. FIG. 3 is an equivalent circuit diagram showing a pixel according to an embodiment of the disclosure.

In an embodiment, the electronic device 1000 may be a device activated in response to an electrical signal. The electronic device 1000 may include various embodiments. In one embodiment, for example, the electronic device 1000 may include a tablet computer, a notebook computer, a smart television, or the like. Hereinafter, for convenience of description, embodiments where the electronic device 1000 is a smartphone will be described in detail.

The electronic device 1000 may display an image IM through a display surface IS, which is substantially parallel to each of a first direction DR1 and a second direction DR2, toward a third direction DR3. The display surface IS, through which the image IM is displayed, may correspond to a front surface of the electronic device 1000 or a front surface of a window 100.

Hereinafter, the display surface and the front surface of the electronic device 1000 and the front surface of the window 100 will be assigned with the same reference numeral. The image IM may include a still image as well as a video. FIG. 1 shows an embodiment where the image IM is a clock widget and application icons.

In an embodiment, front (or upper) and rear (or lower) surfaces of each member of the electronic device 1000 may be defined with respect to a direction in which the image IM is displayed. The front and rear surfaces may be opposite to each other in the third direction DR3, and a normal line direction of each of the front and rear surfaces may be substantially parallel to the third direction DR3. A separation distance between the front and rear surfaces may correspond to a thickness in the third direction DR3 of the electronic device 1000.

According to an embodiment, the electronic device 1000 may sense a user input TC applied thereto from the outside. The user input TC may include various types of external inputs, such as a part of the user's body, light, heat, or pressure. In an embodiment, as shown in FIG. 1, the user input TC may be a touch by a hand of user onto the front surface of the electronic device 1000, for example, but not being limited thereto or thereby. In an embodiment, as described above, the user input TC may be provided in various forms. In an embodiment, the electronic device 1000 may have a structure to sense the user input TC applied to a side or rear surface of the electronic device 1000, but not being limited to a specific embodiment.

In an embodiment, a first area A1 may be defined in a transmission area TA. The first area A1 may be an area of the display module 300, which is described later, overlapping an electronic module 400. In an embodiment, as shown in FIG. 2A, the first area A1 may have a circular shape disposed at an upper right end, for example, but not being limited thereto or thereby. According to an embodiment, the first area A1 may be defined in various numbers and shapes in the display module 300 depending on the shape and the number of the electronic modules 400, but not being particularly limited.

The electronic device 1000 may receive external signals used for the electronic module 400 via the first area A1 or may provide signals output from the electronic module 400 to the outside via the first area A1. According to an embodiment of the disclosure, the first area A1 is defined to overlap the transmission area TA, such that a size of a bezel area BZA defining the transmission area TA may decrease. This will be described in detail later.

Referring to FIG. 2A, an embodiment of the electronic device 1000 may include the window 100, a housing 200, the display module 300, and the electronic module 400. In an embodiment, the window 100 and the housing 200 are coupled to each other to provide an exterior of the electronic device 1000.

The window 100 may include an insulating panel. In one embodiment, for example, the window 100 may include a glass material, a plastic material, or a combination thereof.

The front surface FS of the window 100 may define the front surface of the electronic device 1000 as described above. The transmission area TA may be an optically transparent area. In one embodiment, for example, the transmission area TA may be an area having a visible light transmittance of about 90% or greater.

The bezel area BZA may be an area having a relatively lower transmittance as compared with the transmission area TA. The bezel area BZA may define a shape of the transmission area TA. The bezel area BZA may be disposed adjacent to the transmission area TA and may surround the transmission area TA.

The bezel area BZA may have a predetermined color. The bezel area BZA may be defined by a bezel layer provided separately from a transparent substrate defining the transmission area TA or may be defined by an ink layer formed by being inserted into or colored on the transparent substrate.

The display module 300 may include an electronic panel EP and a driving circuit IC.

The electronic panel EP may display the image IM and may sense an external input. The electronic panel EP may include a front surface IS in which an active area AA and a peripheral area NAA are defined. The active area AA may be an area activated in response to an electrical signal.

In an embodiment, the active area AA may be an area where the image IM is displayed and the external input TC is sensed. The active area AA may be an area in which a plurality of pixels $PX_{ij}$ described later is arranged.

The transmission area TA may overlap at least the active area AA. In one embodiment, for example, the transmission area TA may overlap all or at least a portion of the active area AA. Accordingly, a user may perceive the image IM or may provide the external input TC via the transmission area TA, but not being limited thereto or thereby. Alternatively, an area through which the image IM is displayed and an area through which the external input TC is sensed may be separated from each other in the active area AA, but not being limited to a particular embodiment.

The peripheral area NAA may be covered by the bezel area BZA. The peripheral area NAA may be disposed adjacent to the active area AA. The peripheral area NAA may surround the active area AA. The peripheral area NAA may be an area through which the image IM is not displayed. A driving circuit or a driving line may be disposed in the peripheral area NAA to drive the active area AA.

In an embodiment, the electronic panel EP may be assembled in a flat state in which the active area AA and the peripheral area NAA face the window 100, for example, but not being limited thereto or thereby. According to an embodiment, a portion of the peripheral area NAA of the electronic panel EP may be curved. In one embodiment, for example, the portion of the peripheral area NAA may be bent to the rear surface of the electronic device 1000, and thus, the bezel area BZA in the front surface of the electronic device 1000 may be reduced. Alternatively, the electronic panel EP may be assembled while a portion of the active area AA is in a curved state. Alternatively, the peripheral area NAA may be omitted from the electronic panel EP.

The active area AA may include the first area A1 and a second area A2. The first area A1 may have a relatively higher light transmittance than that of the second area A2. The first area A1 may be defined as an area of the display module 300, which overlaps an area where the electronic module 400 is disposed in the housing 200. In an embodiment, the first area A1 may have a circular shape, but not being limited thereto or thereby. According to an embodiment, the first area A1 may have a variety of shapes, such as a polygonal shape, an oval shape, a shape with at least one curved line, etc., but not being limited thereto or thereby.

The second area A2 is defined adjacent to the first area A1. In an embodiment, the second area A2 surrounds the entire of the first area A1, for example, but not being limited thereto or thereby. According to an alternative embodiment, the second area A2 may be defined adjacent to only a portion of an edge of the first area A1, but not being limited thereto or thereby.

Referring to FIG. 2B, an embodiment of the electronic panel EP may include a display panel 310 and an input sensor 320. The display panel 310 may include configurations to generate the image IM. The image IM generated by the display panel 310 may be displayed on the display surface IS and perceived by the user through the transmission area TA.

The input sensor 320 may sense the external input TC applied thereto from the outside. In an embodiment, as described above, the input sensor 320 may sense the external input TC applied to the window 100.

Referring back to FIG. 2A, the electronic panel EP may include a flat portion FN and a bending portion BN. The flat portion FN may be assembled to be substantially parallel to a plane defined by the first direction DR1 and the second direction DR2. The active area AA may be defined in the flat portion FN.

The bending portion BN may extend and may be bent from the flat portion FN. The bending portion BN may be assembled to be bent from the flat portion FN and disposed on a rear side of the flat portion FN. In such an embodiment, the bending portion BN overlaps the flat portion FN in a plan view when being assembled, such that the bezel area of the electronic device 1000 may decrease. In one alternative embodiment, for example, the bending portion BN may be omitted from the electronic panel EP.

The driving circuit IC may be mounted on the bending portion BN. The driving circuit IC may be provided in a chip form, but not being limited thereto or thereby. According to an alternative embodiment, the driving circuit IC may be electrically connected to the electronic panel EP via a flexible circuit board after being provided to a separate circuit board.

The driving circuit IC may be electrically connected to the active area AA and may apply electrical signals to the active area AA. In one embodiment, for example, the driving circuit IC may include a data driving circuit and may apply data signals to pixels arranged in the active area AA. In one embodiment, for example, the driving circuit IC may include a touch driving circuit and may be electrically connected to the input sensor disposed in the active area AA. Alternatively, the driving circuit IC may be designed to include a variety of circuits in addition to the above-mentioned circuits or to apply a variety of electrical signals to the active area AA, and it should not be particularly limited.

In an embodiment, the electronic device 1000 may further include a main circuit board (not shown) electrically connected to the electronic panel EP and the driving circuit IC. The main circuit board may include various driving circuits to drive the electronic panel EP or a connector to provide a power. The main circuit board may be a rigid printed circuit board ("PCB"), but not being limited thereto or thereby. In an alternative embodiment, the main circuit board may be a flexible circuit board, but not being particularly limited.

The electronic module 400 may be disposed under the display module 300. The electronic module 400 may receive the external input via the first area A1 or may output signals via the first area A1. According to an embodiment of the disclosure, the first area A1 having a relatively high transmittance is defined in the active area AA, such that the electronic module 400 may be disposed to overlap the active area AA. Accordingly, the size of the bezel area BZA may be reduced.

Referring now to FIG. 2B, the electronic device 1000 may include the display module 300, a power supply module PM, a first electronic module EM1, and a second electronic module EM2. The display module 300, the power supply module PM, the first electronic module EM1, and the second electronic module EM2 may be electrically connected to each other. For convenience of illustration, FIG. 2B shows only the display panel 310 and the input sensor 320 among elements of the display module 300.

The power supply module PM may supply a power source used for the overall operation of the electronic device 1000. The power supply module PM may include a conventional battery module.

The first electronic module EM1 and the second electronic module EM2 may include various functional modules to operate the electronic device 1000. The first electronic module EM1 may be mounted directly on a mother board that is electrically connected to the electronic panel EP or may be electrically connected to the mother board via a connector (not shown) after being mounted on a separate substrate.

The first electronic module EM1 may include a control module CM, a wireless communication module TM, an image input module IIM, an audio input module AIM, a memory MM, and an external interface IF. Some modules among the modules may be electrically connected to the mother board through a flexible circuit board without being mounted on the mother board.

The control module CM may control an overall operation of the electronic device 1000. The control module CM may be, but not limited to, a microprocessor. In one embodiment, for example, the control module CM may activate or deactivate the display module 300. The control module CM may control other modules, such as the image input module IIM, the audio input module AIM, or the like, based on a touch signal provided from the electronic panel EP.

The wireless communication module TM may transmit/receive a wireless signal to/from other terminals using a Bluetooth® or Wi-Fi link. The wireless communication module TM may transmit/receive a voice signal using a general communication line. The wireless communication module TM may include a transmitter TM1 that modulates a signal to be transmitted and transmits the modulated signal and a receiver TM2 that demodulates the signal applied thereto.

The image input module IIM may process an image signal and may convert the image signal into image data that may be displayed through the electronic panel EP. The audio input module AIM may receive an external sound signal through a microphone in a record mode or a voice recognition mode and may convert the external sound signal to electrical voice data.

The external interface IF may serve as an interface between the control module CM and external devices, such as an external charger, a wired/wireless data port, a card socket e.g., a memory card and a SIM/UIM card, etc.

The second electronic module EM2 may include an audio output module AOM, a light emitting module LM, a light receiving module LRM, and a camera module CMM. The configurations may be mounted directly on the mother board, may be electrically connected to the electronic panel EP via a connector (not shown) after being mounted on a separate substrate, or may be electrically connected to the first electronic module EM1.

The audio output module AOM may convert the sound data provided from the wireless communication module TM or the sound data stored in the memory MM and may output the converted sound data to the outside.

The light emitting module LM may generate a light and may output the light. The light emitting module LM may emit an infrared ray. The light emitting module LM may include a light emitting diode element. The light receiving module LRM may sense the infrared ray. The light receiving module LRM may be activated when the infrared ray having a predetermined level or higher is sensed. The light receiving module LRM may include a complementary metal oxide semiconductor ("CMOS") sensor. The infrared ray generated by and output from the light emitting module LM may be reflected by an external object, e.g., a user's finger or face, and the reflected infrared ray may be incident into the light receiving module LRM. The camera module CMM may obtain an image of an external object.

According to an embodiment, the electronic module 400 may include at least one selected from the components of the second electronic module EM2. In one embodiment, for example, the electronic module 400 may include at least one selected from a camera, a speaker, a light sensing sensor, and a heat sensing sensor. The electronic module 400 may sense the external object via the first area A1 or may provide a sound signal, such as a voice, to the outside through the first area A1. In such an embodiment, the electronic module 400 may include a plurality of components, but not being limited to a particular embodiment. Although not shown, the electronic module 400 may be attached to the electronic panel EP by a separate adhesive.

Referring back to FIG. 2A, the housing 200 may be coupled to the window 100. The housing 200 may be coupled to the window 100 to provide a predetermined inner space. The display module 300 and the electronic module 400 may be accommodated in the inner space.

The housing 200 may have a material with a relatively high rigidity. In one embodiment, for example, the housing 200 may include a glass, plastic, or metal material or a plurality of frames and/or plates of combinations thereof. The housing 200 may stably protect the components of the electronic device 1000 accommodated in the inner space from external impacts.

FIG. 3 is an equivalent circuit diagram showing a pixel $PX_{ij}$ of the display module 300 according to an embodiment. An embodiment of the pixel $PX_{ij}$, a first pixel disposed in the first area A1, and a second pixel disposed in the second area A2 have a difference only in size, and thus, the first pixel and the second pixel may have the same equivalent circuit diagram as the pixel $PX_{ij}$ shown in FIG. 3.

FIG. 3 shows an embodiment of the pixel $PX_{ij}$ connected to an i-th scan line SLi among scan lines SL1 to SLn of a first group and a j-th data line DLj among data lines DL1 to DLm.

In such an embodiment, a pixel driving circuit may include first to seventh transistors T1 to T7 and a capacitor Cst. In such an embodiment, each of first, second, third, fourth, fifth, sixth, and seventh transistors T1 to T7 may be a P-type transistor, but not being limited thereto or thereby. Alternatively, the first to seventh transistors T1 to T7 may be implemented by one of the P-type transistor or an N-type transistor.

In an embodiment, at least one selected from the first to seventh transistors T1 to T7 may be omitted. In an embodiment, at least one selected from the first to seventh transistors T1 to T7 may include a semiconductor layer including oxide, and the other of the first to seventh transistors T1 to T7 may include a semiconductor layer including silicon.

In an embodiment, the first transistor T1 may be a driving transistor, and the second transistor T2 may be a switching transistor. The capacitor Cst may be connected between a first power line PL to which a first power supply voltage ELVDD is applied and a reference node RD. The capacitor Cst may include a first electrode Cst1 connected to the reference node RD and a second electrode Cst2 connected to the first power line PL.

The first transistor T1 may be connected between the first power line PL and one electrode of a light emitting diode OLED. A source S1 of the first transistor T1 may be electrically connected to the first power line PL. Another transistor may be disposed between the source S1 of the first transistor T1 and the first power line PL or a pre-arranged transistor may be omitted between the source S1 of the first transistor T1 and the first power line PL.

Here, the expression "a transistor is electrically connected to a signal line or a transistor is electrically connected to another transistor" means that a source, a drain, or a gate of the transistor is integrally formed with that of another transistor or the signal line, or the source, the drain, or the gate of the transistor is connected to that of another transistor or the signal line via a connection electrode.

A drain D1 of the first transistor T1 may be electrically connected to an anode of the light emitting diode OLED. Another transistor may be disposed between the drain D1 of the first transistor T1 and the anode of the light emitting diode OLED or a pre-arranged transistor may be omitted between the drain D1 of the first transistor T1 and the anode of the light emitting diode OLED. A gate G1 of the first transistor T1 may be electrically connected to the reference node RD.

The second transistor T2 may be connected between the j-th data line DLj and the source S1 of the first transistor T1. A source S2 of the second transistor T2 may be electrically connected to the j-th data line DLj, and a drain D2 of the second transistor T2 may be electrically connected to the source S1 of the first transistor T1. In an embodiment, a gate G2 of the second transistor T2 may be electrically connected to the i-th scan line SLi of the first group, to which an i-th first scan signal GWPi is applied.

The third transistor T3 may be connected between the reference node RD and the drain D1 of the first transistor T1. A drain D3 of the third transistor T3 may be electrically connected to the drain D1 of the first transistor T1, and a source S3 of the third transistor T3 may be electrically connected to the reference node RD. In such an embodiment, a gate G3 of the third transistor T3 may be electrically connected to an i-th scan line GLi of a second group, to which an i-th second scan signal GWNi is applied.

The fourth transistor T4 may be connected between the reference node RD and a second power line RL. A drain D4 of the fourth transistor T4 may be electrically connected to the reference node RD, and a source S4 of the fourth transistor T4 may be electrically connected to the second power line RL to which an initialization voltage Vint is applied. In an embodiment, a gate G4 of the fourth transistor T4 may be electrically connected to an i-th scan line HLi of a third group, to which an i-th third scan signal GIi is applied.

The fifth transistor T5 may be connected between the first power line PL and the source S1 of the first transistor T1. A source S5 of the fifth transistor T5 may be electrically connected to the first power line PL, and a drain D5 of the fifth transistor T5 may be electrically connected to the source S1 of the first transistor T1. A gate G5 of the fifth transistor T5 may be electrically connected to an i-th light emitting line Eli to which an i-th emission signal Ei is applied.

The sixth transistor T6 may be connected between the drain D1 of the first transistor T1 and the light emitting diode OLED. A source S6 of the sixth transistor T6 may be electrically connected to the drain D1 of the first transistor T1, and a drain D6 of the sixth transistor T6 may be electrically connected to the anode of the light emitting diode OLED. A gate G6 of the sixth transistor T6 may be electrically connected to the i-th light emitting line ELi.

The seventh transistor T7 may be connected between the drain D6 of the sixth transistor T6 and the second power line RL. A source S7 of the seventh transistor T7 may be electrically connected to the drain D6 of the sixth transistor T6, and a drain D7 of the seventh transistor T7 may be electrically connected to the second power line RL. A gate G7 of the seventh transistor T7 may be electrically connected to an (i+1)-th scan line SLi+1 of the first group to which an (i+1)-th first scan signal GWPi+1 is applied.

The anode of the light emitting diode OLED is connected to the drain D6 of the sixth transistor T6, and a cathode of the light emitting diode OLED is connected to a second power supply voltage ELVSS.

Figure 4:
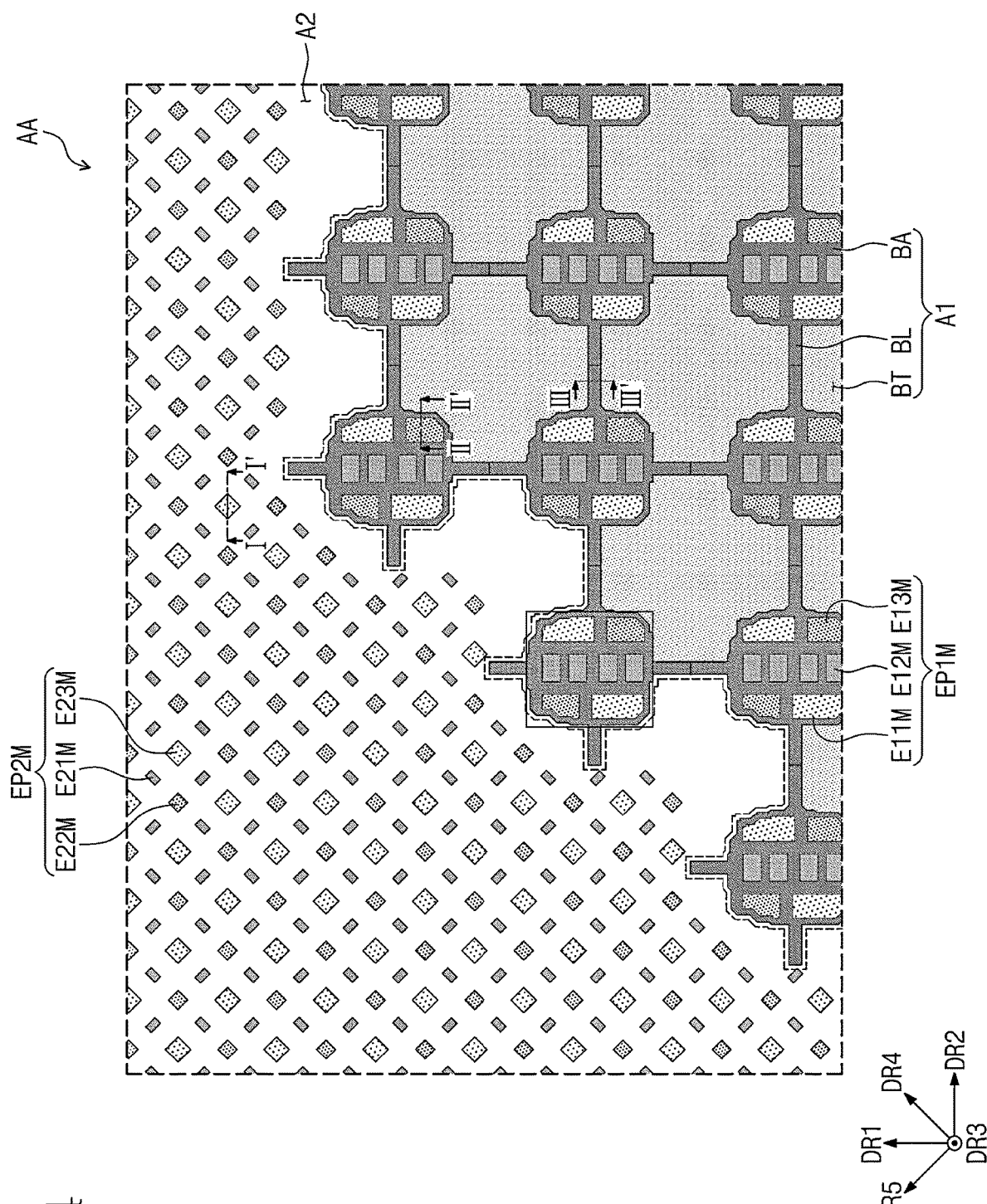
FIG. 4 is a plan view showing an active area according to an embodiment of the disclosure.
Figure 5:
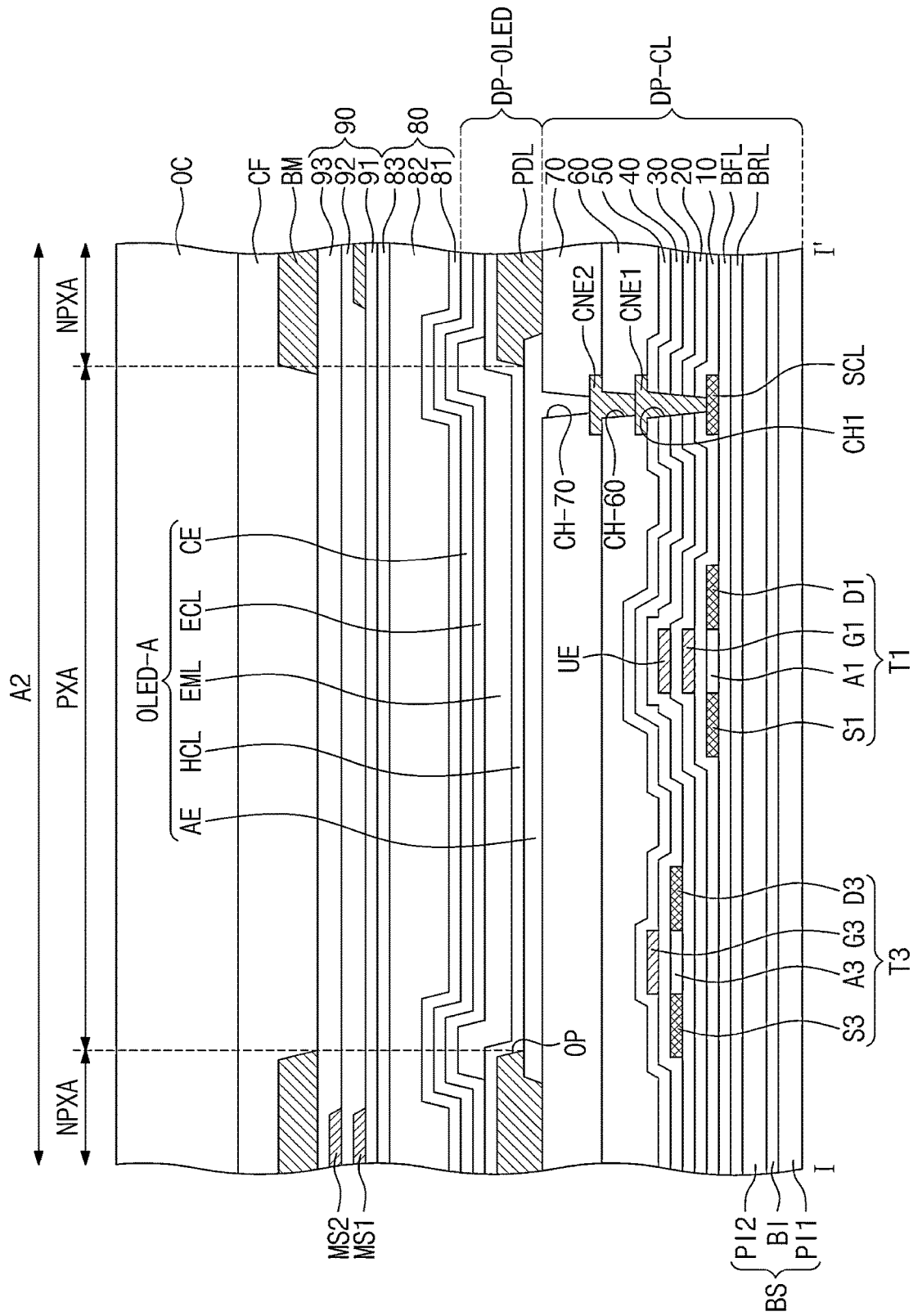
FIG. 5 is a cross-sectional view taken along line I-I' shown in FIG. 4.
Figure 6:
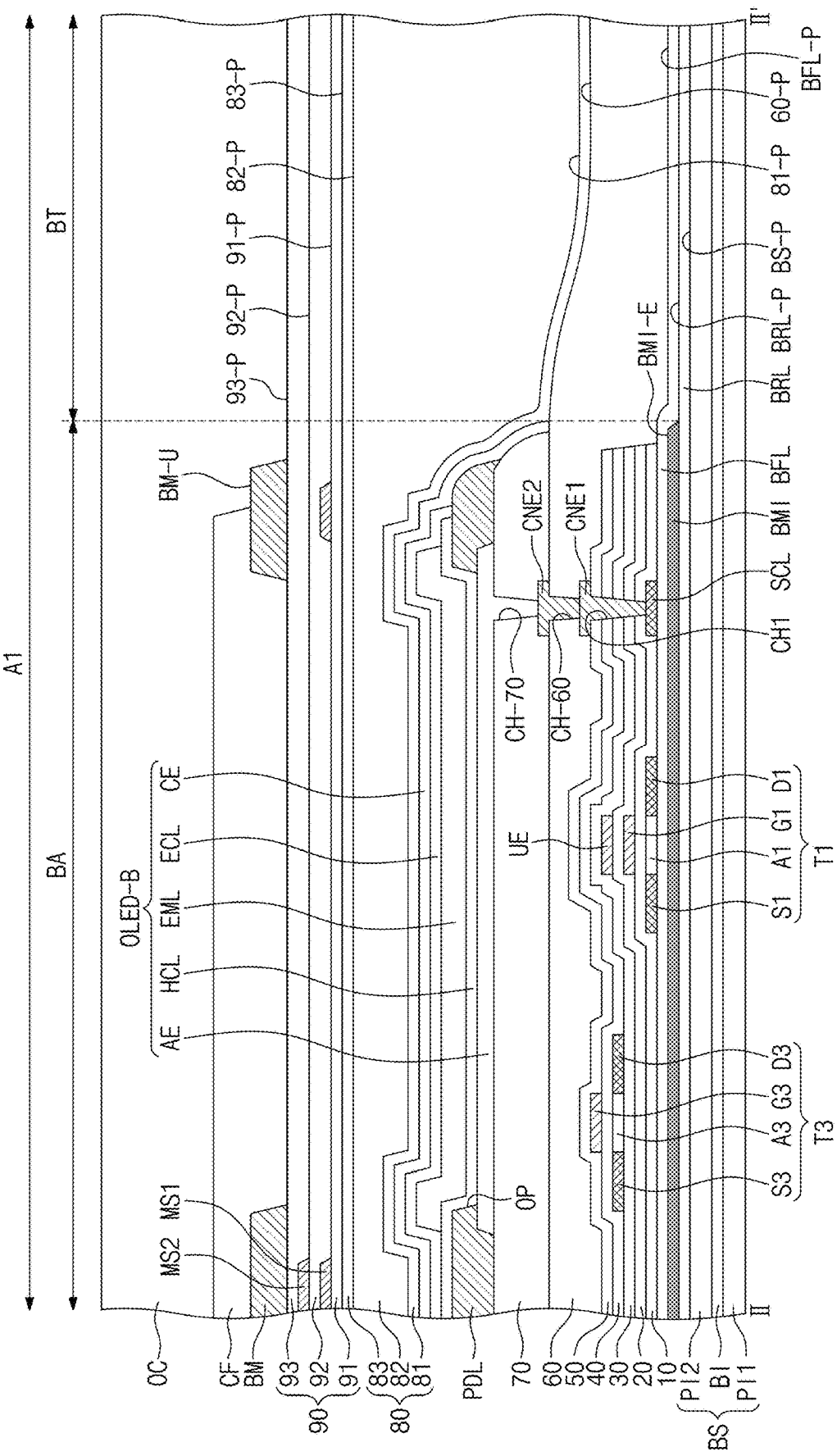
FIG. 6 is a cross-sectional view taken along line II-II' shown in FIG. 4.
Figure 7:
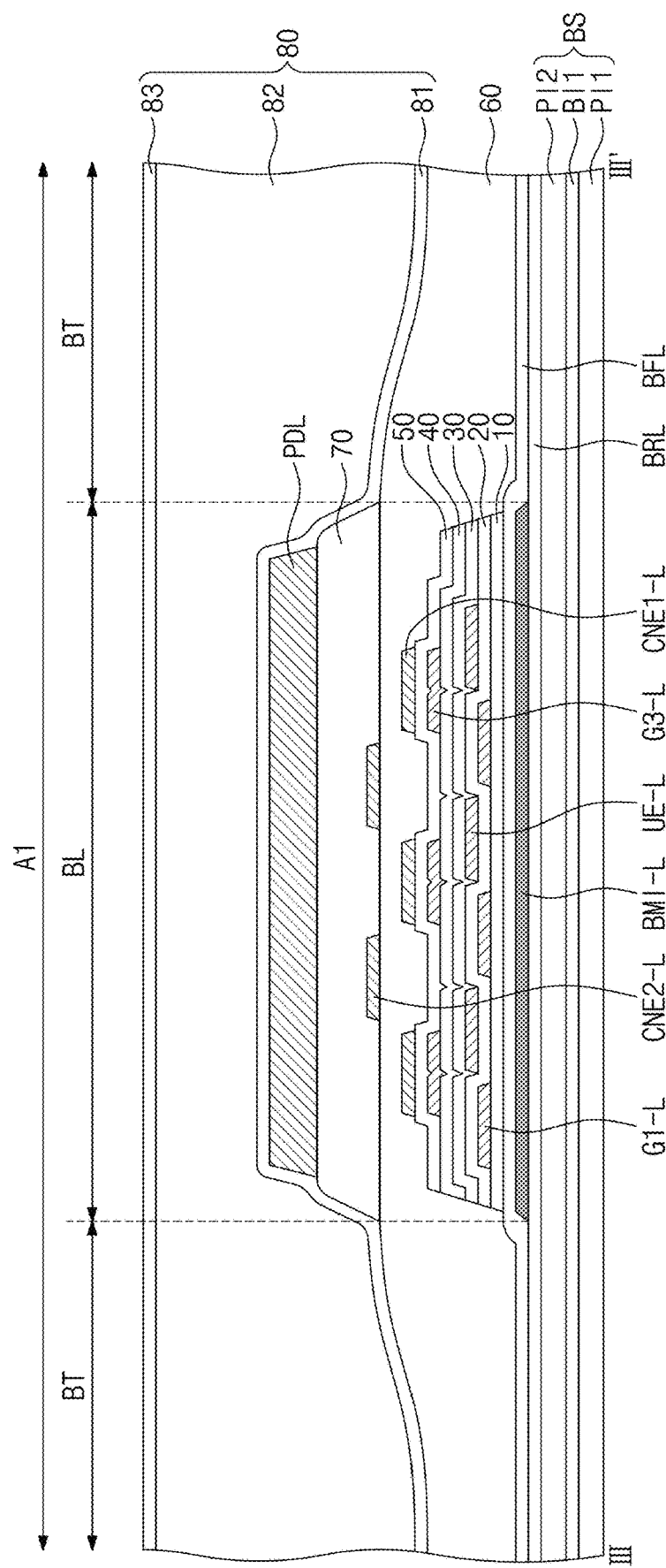
FIG. 7 is a cross-sectional view taken along line III-III' shown in FIG. 4.

FIG. 4 is a plan view showing the active area AA according to an embodiment of the disclosure. FIG. 5 is a cross-sectional view taken along line I-I' shown in FIG. 4. FIG. 6 is a cross-sectional view taken along line II-II' shown in FIG. 4. FIG. 7 is a cross-sectional view taken along line III-III' shown in FIG. 4.

Referring to FIG. 4, an embodiment of the display module 300 may include the first pixel EP1M disposed in the first area A1 and the second pixel EP2M disposed in the second area A2. The first pixel EP1M and the second pixel EP2M may have different light emitting areas from each other, and the first pixel EP1M and the second pixel EP2M may be arranged in different arrangements from each other. The first pixel EP1M may be provided in plural in the first area A1, and the first pixels EP1M may be arranged to be spaced apart from each other in the first direction DR1 and the second direction DR2.

The first pixel EP1M may include a plurality of first sub-pixels E11M, E12M, and E13M.

First-first sub-pixels E11M may be spaced apart from each other with second first sub-pixels E12M interposed therebetween in second direction DR2, and two first first sub-pixels E11M spaced apart from each other may be arranged in a diagonal direction along a fourth direction DR4. In an embodiment, the first first sub-pixels E11M may emit a red light.

The first-second sub-pixels E12M may be disposed between the first first sub-pixels E11M and third first sub-pixels E13M. In an embodiment, four second first sub-pixels E12M may be arranged in the first direction DR1 and may be spaced apart from each other. In an embodiment, the second first sub-pixels E12M may emit a green light. The first-third sub-pixels E13M may be spaced apart from each other with the second first sub-pixels E12M interposed therebetween in the second direction DR2, and two third first sub-pixels E13M spaced apart from each other may be arranged in a diagonal direction along a fifth direction DR5. In an embodiment, the third first sub-pixels E13M may emit a blue light.

In such an embodiment, one third first sub-pixel E13M disposed at a left side with respect to the second first sub-pixels E12M may be disposed on one first first sub-pixel E11M in the first direction DR1, and another third first sub-pixel E13M disposed at a right side with respect to the second first sub-pixels E12M may be disposed under another first first sub-pixel E11M in the first direction DR1.

An emission area of each of the first sub-pixels E11M, E12M, and E13M may increase in the order of the second first sub-pixel E12M, the third first sub-pixel E13M, and the first first sub-pixel E11M.

The second pixel EP2M may be provided in plural, and each of the second pixels EP2M may include a plurality of second sub-pixels E21M, E22M, and E23M. The second pixels EP2M may be arranged in the first direction DR1 and the second direction DR2 and may be spaced apart from each other.

In an embodiment, an arrangement structure of the second sub-pixels E21M, E22M, and E23M arranged in the second area A2 may be called a pentile structure.

Second second sub-pixels E22M may be spaced apart from each other with respect to a first second sub-pixel E21M in the fourth direction DR4, and third second sub-pixels E23M may be spaced apart from each other with respect to the second-first sub-pixel E21M in the fifth direction DR5. The third second sub-pixel E23M may be spaced apart from the second second sub-pixel E22M in the second direction DR2.

The first second sub-pixel E21M may have a rectangular shape defined by the fourth direction DR4 and the fifth direction DR5. In an embodiment, the first second sub-pixel E21M may emit the green light. The first second sub-pixel E21M may have a lozenge shape with respect to the second first sub-pixels E12M that emit the same color among the first sub-pixels E11M, E12M, and E13M disposed in the first area A1.

The second second sub-pixel E22M may have a square shape defined by the fourth direction DR4 and the fifth direction DR5. In an embodiment, the second second sub-pixel E22M may emit the blue light. The second second sub-pixel E22M may have a lozenge shape with respect to the third first sub-pixels E13M that emit the same color among the first sub-pixels E11M, E12M, and E13M disposed in the first area A1.

The third second sub-pixel E23M may have a square shape defined by the fourth direction DR4 and the fifth direction DR5. In an embodiment, the third second sub-pixel E23M may emit the red light. The third second sub-pixel E23M may have the lozenge shape with respect to the first first sub-pixels E11M that emit the same color among the first sub-pixels E11M, E12M, and E13M disposed in the first area A1.

An emission area of each of the second sub-pixels E21M, E22M, and E23M may increase in the order of the first second sub-pixel E21M, the second second sub-pixel E22M, and the third second sub-pixel E23M.

According to an embodiment of the disclosure, the first area A1 may be divided into a display area BA, a line area BL, and a transmission area BT. The display area BA and the line area BL may be areas in which conductive materials for the pixel $PX_{ij}$ are patterned. In a case where the electronic module 400 receives and transmits a light, the light reflected by the conductive materials may cause a deterioration in performance of the electronic module 400.

According to an embodiment of the disclosure, a light blocking layer BMI is disposed to overlap the display area BA and the line area BL of the first area A1 and is disposed not to overlap the transmission area TA of the first area A1, such that the deterioration in performance of the electronic module 400 described above may be improved. Details of the light blocking layer BMI will be described in detail later. In FIG. 4, the display area BA and the line area BL where the light blocking layer BKI is disposed in the first area A1 is illustrated in a relatively dark color compared with the transmission area BT.

FIGS. 5 and 6 show cross-sections of portions corresponding to the first transistor T1 and the third transistor T3 among the first to seventh transistors T1 to T7 described above with reference to FIG. 3.

An area of the display module 300, which overlaps the second area A2, may include the display panel 310 (refer to FIG. 2B), the input sensor 90 (corresponding to 320 of FIG. 2B), a black matrix BM, a color filter CF, and an overcoat layer OC.

The display panel 310 may include a circuit element layer DP-CL, a display element layer DP-OLED, and a thin film encapsulation layer 80.

The display panel 310 may further include functional layers such as an anti-reflective layer, a refractive index control layer, or the like. The circuit element layer DP-CL may include a plurality of insulating layers and a circuit element. In such an embodiment, the insulating layers may include an organic layer and/or an inorganic layer.

An insulating layer, a semiconductor layer, and a conductive layer may be formed by a coating or depositing process. Then, the insulating layer, the semiconductor layer, and the conductive layer may be selectively patterned by a photolithography process. Thus, the semiconductor pattern, the conductive pattern, and the signal line may be formed.

A base layer BS may serve as a base layer on which the other components of the circuit element layer DP-CL are disposed. The base layer BS may have a structure in which a layer including an organic material and a layer including an inorganic material are alternately stacked with each other. In one embodiment, for example, the base layer BS may include a first base layer PI1, a first barrier layer BI, and a second base layer PI2.

The first base layer PI1 may be disposed under the first barrier layer BI. The first base layer PI1 may include an organic material. In one embodiment, for example, the first base layer PI1 may include at least one selected from polyimide ("PI"), polyethylene naphthalate ("PEN"), polyethylene terephthalate ("PET"), polyarylate, polycarbonate ("PC"), polyetherimide ("PEI"), and polyethersulfone ("PES").

The first barrier layer BI may be disposed on the first base layer PI1. The first barrier layer BI may include an inorganic material. In one embodiment, for example, the first barrier layer BI may include at least one selected from silicon oxide, silicon oxynitride, aluminum oxide, titanium oxide, silicon nitride, zirconium oxide, and hafnium oxide.

The second base layer PI2 may be disposed on the first barrier layer BI. The second base layer PI2 may include an organic material. The organic material included in the second base layer PI2 may be the same as the organic material included in the first base layer BI1.

In an alternative embodiment, the base layer BS may have a single-layer structure. In such an embodiment, the base layer BS may include a synthetic resin layer. The synthetic resin layer may include a heat-curable resin. In such an embodiment, the synthetic resin layer may be a polyimide-based resin layer, however, a material for the synthetic resin layer should not be particularly limited. In an embodiment, the base layer BS may include a glass, metal, or organic/inorganic composite material.

A second barrier layer BRL may be disposed on the base layer BS. The second barrier layer BRL may include an inorganic material. In one embodiment, for example, the second barrier layer BRL may include at least one selected from silicon oxide, aluminum oxide, titanium oxide, silicon nitride, silicon oxynitride, zirconium oxide, and hafnium oxide.

A buffer layer BFL may be disposed on the second barrier layer BRL. The buffer layer BFL may improve an adhesive force between the second barrier layer BRL and the semiconductor pattern and/or between the second barrier layer BRL and the conductive pattern. The buffer layer BFL may include at least one of silicon oxide and silicon nitride. In an embodiment, the buffer layer BFL may have a single-layer or multi-layer structure of silicon oxynitride, but not being thereto or thereby.

A semiconductor pattern may be disposed on the buffer layer BFL. Hereinafter, the semiconductor pattern disposed directly on the buffer layer BFL may be defined as a first semiconductor pattern. The first semiconductor pattern may include silicon semiconductor. The first semiconductor pattern may include polysilicon, but not being limited thereto or thereby. According to an alternative embodiment, the first semiconductor pattern may include amorphous silicon.

FIG. 5 shows a portion of the first semiconductor pattern, and the first semiconductor pattern may be further disposed in another area of the pixel $PX_{ij}$ (refer to FIG. 3). The first semiconductor pattern may have different electrical properties depending on whether it is doped or not or whether it is doped with an N-type dopant or a P-type dopant. The first semiconductor pattern may include a doped region and a non-doped region. The doped region may be doped with the N-type dopant or the P-type dopant. The P-type transistor may include the doped region doped with the P-type dopants.

The source S1, an active A1, and the drain D1 of the first transistor T1 may be formed from or defined by the semiconductor pattern. The source S1 and the drain D1 may be formed to be spaced apart from each other with the active A1 interposed therebetween.

A connection signal line SCL may be disposed on the buffer layer BFL. The connection signal line SCL may be connected to the drain D6 of the sixth transistor T6 (refer to FIG. 3) when viewed in a plan view.

The light blocking layer BMI may be disposed on the buffer layer BFL, and the buffer layer BFL may be covered by a first insulating layer 10. The first insulating layer 10 may be an inorganic layer and/or an organic layer and may have a single-layer or multi-layer structure. The first insulating layer 10 may include at least one selected from aluminum oxide, titanium oxide, silicon oxide, silicon nitride, silicon oxynitride, zirconium oxide, and hafnium oxide.

In an embodiment, the first insulating layer 10 may be disposed on the buffer layer BFL and may cover the first semiconductor pattern and the connection signal line SCL. In an embodiment, the first insulating layer 10 may have a single-layer structure of a silicon oxide layer. Not only the first insulating layer 10, but also an insulating layer of the circuit element layer DP-CL described later may be an inorganic layer and/or an organic layer and may have a single-layer or multi-layer structure. The inorganic layer may include at least one selected from the above-mentioned materials.

The gate G1 of the first transistor T1 may be disposed on the first insulating layer 10. The gate G1 may be a portion of a metal pattern. The gate G1 of the first transistor T1 may overlap the active A1 of the first transistor T1. The gate G1 of the first transistor T1 may be used or function as a mask in a process of doping the first semiconductor pattern.

A second insulating layer 20 may be disposed on the first insulating layer 10 and may cover the gate G1. The second insulating layer 20 may be an inorganic layer and/or an organic layer and may have a single-layer or multi-layer structure. In an embodiment, the second insulating layer 20 may have a single-layer structure of a silicon nitride layer.

An upper electrode UE may be disposed on the second insulating layer 20. The upper electrode UE may overlap the gate G1. The upper electrode UE may be a portion of a metal pattern or a portion of the doped semiconductor pattern. A portion of the gate G1 and the upper electrode UE overlapping the portion of the gate G1 may define the capacitor Cst (refer to FIG. 3). According to an alternative embodiment, the upper electrode UE may be omitted.

According to an embodiment, the second insulating layer 20 may be replaced with an insulating pattern. The upper electrode UE may be disposed on the insulating pattern. The upper electrode UE may serve as a mask to form the insulating pattern from the second insulating layer 20.

Although not shown in figures, the first electrode Cst1 and the second electrode Cst2 of the capacitor Cst (refer to FIG. 3) may be formed through a same process as those of the gate G1 and the upper electrode UE. The first electrode Cst1 may be disposed on the first insulating layer 10. The first electrode Cst1 may be electrically connected to the gate G1. The first electrode Cst1 may be integrally formed with the gate G1 as a single unitary unit.

A third insulating layer 30 may be disposed on the second insulating layer 20 and may cover the upper electrode UE. In an embodiment, the third insulating layer 30 may include a plurality of silicon oxide layers and a plurality of silicon nitride layers alternately stacked with the silicon oxide layers. Although not shown in figures, The sources S2, S5, S6, and S7 (refer to FIG. 3), the drains D2, D5, D6, and D7 (refer to FIG. 3), and the gates G2, G5, G6, and G7 (refer to FIG. 3) of the second, fifth, sixth, and seventh transistors T2, T5, T6, and T7 (refer to FIG. 3) may be formed through a same processes as those of the source S1, the drain D1, and the gate G1 of the first transistor T1, respectively.

A semiconductor pattern may be disposed on the third insulating layer 30. Hereinafter, the semiconductor pattern disposed directly on the third insulating layer 30 may be defined as a second semiconductor pattern. The second semiconductor pattern may include metal oxide. The oxide semiconductor may include a crystalline or amorphous oxide semiconductor.

In one embodiment, for example, the oxide semiconductor may include at least one selected from the metal oxide of metals, such as zinc (Zn), indium (In), gallium (Ga), tin (Sn), titanium (Ti), etc., or a mixture of the metal, such as zinc (Zn), indium (In), gallium (Ga), tin (Sn), titanium (Ti), etc., and oxides thereof. The oxide semiconductor may include indium-tin oxide ("ITO"), indium-gallium-zinc oxide ("IGZO"), zinc oxide (ZnO), indium-zinc oxide (InZnO), zinc-indium oxide ("ZIO"), indium oxide (InO), titanium oxide (TiO), indium-zinc-tin oxide ("IZTO"), zinc-tin oxide ("ZTO"), or the like.

In an embodiment, as shown in FIG. 5, the source S3, an active A3, and the drain D3 of the third transistor T3 may be formed from (or defined by portions of) the second semiconductor pattern. The source S3 and the drain D3 may include a metal reduced from a metal oxide semiconductor. The source S3 and the drain D3 may include a metal layer having a predetermined thickness from an upper surface of the second semiconductor pattern and including the reduced metal.

A fourth insulating layer 40 may be disposed on the third insulating layer 30 to cover the second semiconductor pattern. In an embodiment, the fourth insulating layer 40 may have a single-layer structure of a silicon oxide layer. The gate G3 of the third transistor T3 may be disposed on the fourth insulating layer 40. The gate G3 may be a portion of the metal pattern. The gate G3 of the third transistor T3 may overlap the active A3 of the third transistor T3.

According to an embodiment, the fourth insulating layer 40 may be replaced with an insulating pattern. The gate G3 of the third transistor T3 may be disposed on the insulating pattern. In an embodiment, the gate G3 may have a same shape as that of the insulating pattern when viewed in a plan view.

A fifth insulating layer 50 may be disposed on the fourth insulating layer 40 to cover the gate G3. In an embodiment, the fifth insulating layer 50 may include a silicon oxide layer and a silicon nitride layer. The fifth insulating layer 50 may include a plurality of silicon oxide layers and a plurality of silicon nitride layers alternately staked with the silicon oxide layers.

Although not shown in figures, the source S4 (refer to FIG. 3), the drain D4 (refer to FIG. 3), and the gate G4 (refer to FIG. 3) of the fourth transistor T4 (refer to FIG. 3) may be formed through a same process as those of the source S3, the drain D3, and the gate G3 of the third transistor T3, respectively.

At least one insulating layer may be further disposed on the fifth insulating layer 50. In an embodiment, a sixth insulating layer 60 and a seventh insulating layer 70 may be disposed on the fifth insulating layer 50. Each of the sixth insulating layer 60 and the seventh insulating layer 70 may be an organic layer and may have a single-layer or multi-layer structure. In an embodiment, each of the sixth insulating layer 60 and the seventh insulating layer 70 may have a single-layer structure of a polyimide-based resin layer, for example, but not being limited thereto or thereby.

According to an alternative embodiment, each of sixth insulating layer 60 and the seventh insulating layer 70 may include at least one selected from an acrylate-based resin, a methacrylate-based resin, a polyisoprene-based resin, a vinyl-based resin, an epoxy-based resin, a urethane-based resin, a cellulose-based resin, a siloxane-based resin, a polyamide-based resin, and a perylene-based resin.

A first connection electrode CNE1 may be disposed on the fifth insulating layer 50. The first connection electrode CNE1 may be connected to the connection signal line SCL or a connection electrode via a first contact hole CH1 defined through the first to fifth insulating layers 10 to 50.

A second connection electrode CNE2 may be disposed on the sixth insulating layer 60. The second connection electrode CNE2 may be connected to the first connection electrode CNE1 via a second contact hole CH-60 defined through the sixth insulating layer 60.

A light emitting diode OLED-A may be disposed on the seventh insulating layer 70. An anode of the light emitting diode OLED-A may be disposed on the seventh insulating layer 70. A pixel definition layer PDL may be disposed on the seventh insulating layer 70. The pixel definition layer PDL may be provided with an opening OP defined therethrough to expose at least a portion of the first electrode AE. In an embodiment, the pixel definition layer PDL may include a light absorbing material. In one embodiment, for example, the pixel definition layer PDL may have a black color.

The first to seventh transistors T1 to T7 (refer to FIG. 3) connected to the light emitting diode OLED-A may form one second pixel EP2M (refer to FIG. 4).

The opening OP of the pixel definition layer PDL may define a light emitting area PXA. In one embodiment, for example, the pixels $PX_{ij}$ (refer to FIG. 2A) may be regularly arranged on the display panel 310 (refer to FIG. 2A) when viewed in a plan view. The area in which the pixels $PX_{ij}$ are arranged may be referred to as a pixel area, and one pixel area may include the light emitting area PXA and a non-light-emitting area NPXA adjacent to the light emitting area PXA. The non-light-emitting area NPXA may surround the light emitting area PXA.

The first electrode AE may be disposed on the seventh insulating layer 70. The first electrode AE may be connected to the second connection electrode CNE2 via a third contact hole CH-70 defined through the seventh insulating layer 70.

A hole control layer HCL may be commonly disposed in the light emitting area PXA and the non-light-emitting area NPXA. A common layer like the hole control layer HCL may be commonly formed over the pixels $PX_{ij}$. The hole control layer HCL may include a hole transport layer and a hole injection layer.

A light emitting layer EML may be disposed on the hole control layer HCL. The light emitting layer EML may be disposed only in an area corresponding to the opening OP. The light emitting layer EML may be formed in each of the pixels $PX_{ij}$ after being divided into plural portions.

In an embodiment, as shown in FIG. 5, the light emitting layer EML may be a patterned layer, but not being limited thereto or thereby. Alternatively, the light emitting layer EML may be commonly disposed over the pixels $PX_{ij}$. In such an embodiment, the light emitting layer EML may generate a white light or a blue light. In an embodiment, the light emitting layer EML may have a multi-layer structure.

An electron control layer ECL may be disposed on the light emitting layer EML. The electron control layer ECL may include an electron transport layer and an electron injection layer. A second electrode CE may be disposed on the electron control layer ECL. The electron control layer ECL and the second electrode CE may be commonly disposed in the pixels $PX_{ij}$.

The thin film encapsulation layer 80 may be disposed on the second electrode CE. The thin film encapsulation layer 80 may be commonly disposed over the pixels $PX_{ij}$. In an embodiment, the thin film encapsulation layer 80 may directly cover the second electrode CE.

The thin film encapsulation layer 80 may include a first inorganic layer 81, an organic layer 82, and a second inorganic layer 83, but not being limited thereto or thereby. According to an embodiment, the thin film encapsulation layer 80 may further include a plurality of inorganic layers and a plurality of organic layers.

The first inorganic layer 81 may be in contact with the second electrode CE. The first inorganic layer 81 may prevent external moisture or oxygen from entering the light emitting layer EML. In one embodiment, for example, the first inorganic layer 81 may include silicon nitride, silicon oxide, or a combination thereof. The first inorganic layer 81 may be formed through a deposition process.

The organic layer 82 may be disposed on the first inorganic layer 81 and may be in contact with the first inorganic layer 81. The organic layer 82 may provide a flat surface on the first inorganic layer 81. An uneven shape formed on an upper surface of the first inorganic layer 81 or particles existing on the first inorganic layer 81 may be covered by the organic layer 82, and thus, a surface state of the upper surface of the first inorganic layer 81, which is exerted on components formed on the organic layer 82, may be improved. The organic layer 82 may include an organic material and may be formed by a solution process, such as a spin coating, a slit coating, or an inkjet process.

The second inorganic layer 83 may be disposed on the organic layer 82 to cover the organic layer 82. The second inorganic layer 83 may be stably formed on a relatively flat surface than being disposed on the first inorganic layer 81. The second inorganic layer 83 may encapsulate moisture leaked from the organic layer 82 to prevent the moisture from flowing to the outside. The second inorganic layer 83 may include silicon nitride, silicon oxide, or a compound thereof. The second inorganic layer 83 may be formed by a chemical vapor deposition process.

The input sensor 320 (in FIG. 2B) may be disposed directly on the thin film encapsulation layer 80. The input sensor 320 may include a plurality of conductive patterns MS1 and MS2 and a sensing insulating layer 90. The sensing insulating layer 90 may include a first sensing insulating layer 91, a second sensing insulating layer 92, and a third sensing insulating layer 93. Each of the first sensing insulating layer 91, the second sensing insulating layer 92, and the third sensing insulating layer 93 may include at least one of an inorganic material and an organic material.

The first sensing insulating layer 91 may be disposed on the thin film encapsulation layer 80. First conductive patterns MS1 may be disposed on the first sensing insulating layer 91 and may be covered by the second sensing insulating layer 92. Second conductive patterns MS2 may be disposed on the second sensing insulating layer 92 and may be covered by the third sensing insulating layer 93.

Each of the first and second conductive patterns MS1 and MS2 may have a conductivity. Each of the first and second conductive patterns MS1 and MS2 may have a single-layer structure or a multi-layer structure, but not being limited thereto or thereby. At least one selected from the first conductive patterns MS1 and the second conductive patterns MS2 may be in a mesh-like shape or provided as a mesh lines when viewed in a plan view.

The mesh lines forming the conductive patterns MS1 and MS2 may be spaced apart from the light emitting layer EML when viewed in a plan view. Accordingly, although the input sensor 320 is directly formed on the display panel 310, the light generated by the pixels $PX_{ij}$ (refer to FIG. 2B) of the display panel 310 may be provided to the user without being interfered by the input sensor 320.

The color filter CF may overlap the light emitting layer EML. The color filter CF may selectively transmit a light corresponding to a light provided from the light emitting layer EML. In one embodiment, for example, when the light emitting layer EML provides a blue light, the color filter CF may be a blue color filter that transmits the blue light.

The color filter CF may include a polymer photosensitive resin and a pigment or dye. In one embodiment, for example, the color filter CF overlapping the light emitting layer EML providing the blue light may include a blue pigment or dye, the color filter CF overlapping the light emitting layer EML providing the green light may include a green pigment or dye, and the color filter CF overlapping the light emitting layer EML providing the red light may include a red pigment or dye, but not being limited thereto or thereby.

In an alternative embodiment, the color filter CF overlapping the light emitting layer EML providing the blue light may not include the pigment or dye. In such an embodiment, the color filter CF may be transparent, and the color filter CF may include or be formed of a transparent photosensitive resin.

The black matrix BM may be disposed between the color filters providing different lights from each other. The black matrix BM may be a pattern with a black color, e.g., a matrix having a lattice shape. The black matrix BM may include a black coloring agent. The black coloring agent may include a black pigment or a black dye. The black coloring agent may include a metal material, such as carbon black, chrome, etc., or an oxide thereof.

The overcoat layer OC may be disposed on the color filter CF and the black matrix BM. The overcoat layer OC may cover concave-convex portions occurring when the color filter CF and the black matrix BM are formed to provide a flat surface. In such an embodiment, the overcoat layer OC may be a planarization layer.

The window 100 described above with reference to FIG. 2A may be coupled to the overcoat layer OC that provides the flat surface by an adhesive layer.

FIG. 6 is a cross-sectional view showing a portion of each of the display area BA and the transmission area BT of the first area A1 when the electronic module 400 (refer to FIG. 2B) overlaps the display module 300 (refer to FIG. 2B), and FIG. 7 is a cross-sectional view showing the line area BL disposed between transmission areas BT of the first area A1.

The first pixel EP1M (refer to FIG. 4) disposed in the first area A1 may include the first to seventh transistors T1 to T7 (refer to FIG. 3) connected to a light emitting diode OLED-B, and a stack structure of the first pixel EP1M may be substantially the same as that of the second pixel EP2M disposed in the second area A2 described above with reference to FIG. 5.

In such an embodiment, in the first pixel EP1M, the first semiconductor pattern, which includes polysilicon, of the first transistor T1 may be disposed on the buffer layer BFL, and the second semiconductor pattern, which includes a metal oxide, of the third transistor T3 may be disposed on the third insulating layer 30.

Hereinafter, differences regarding an arrangement relationship of insulating layers in the transmission area BT will be mainly described.

According to an embodiment of the disclosure, the light blocking layer BMI may be disposed in the display area BA of the first area A1. In such an embodiment, the light blocking layer BMI may overlap the display area BA of the first area A1 and may not overlap the transmission area BT of the first area A1. The light blocking layer BMI may be disposed between the second barrier layer BRL and the buffer layer BFL. The light blocking layer BMI may include a metal material.

Alternatively, the second barrier layer BRL may be omitted, the light blocking layer BMI may be disposed between the base layer BS and the buffer layer BFL, but not being limited thereto or thereby.

The light blocking layer BMI may be disposed on the second barrier layer BRL to prevent conductive materials disposed on the base layer BS and the second barrier layer BRL from being perceived as the electronic module 400 due to the external light. Accordingly, although the electronic module 400 is disposed in the active area AA (refer to FIG. 2A), an interference with the conductive materials disposed on the base layer BS and the second barrier layer BRL may be reduced, and thus, the performance of the electronic module 400 of the electronic device 1000 may be improved.

The transmission area BT of the first area A1 may be surrounded by the display area BA and the line area BL. The transmission area BT may correspond to an area in which conductive materials or insulating layers are patterned after being deposited or are not deposited to increase the light transmittance. In an embodiment, the transmission area BT may have a cross shape, but not being limited thereto or thereby.

In an alternative embodiment, the shape of the transmission area BT may be changed in various ways according to the arrangement of the light blocking layer BMI, but not being particularly limited.

According to an embodiment, the transmission area BT may be defined by omitting (or removing) portions of the insulating layers, which overlap the transmission area BT, from the first to seventh insulating layers 10 to 70.

In an embodiment, among the first to seventh insulating layers 10 to 70 included in the display panel 310 (refer to FIG. 2B), the first insulating layer 10, the second insulating layer 20, the third insulating layer 30, the fourth insulating layer 40, the fifth insulating layer 50, and the seventh insulating layer 70 may not be deposited or may be patterned after being deposited in an area corresponding to the transmission area BT. According to an embodiment, where the insulating layers are patterned, an edge BMI-E of the light blocking layer BMI may be disposed closer to the transmission area BT than a side surface of each of the patterned insulating layers is.

In an embodiment, in the transmission area BT, a base layer portion BS-P, a second barrier layer a portion BRL-P, a buffer layer portion BFL-P, a sixth insulating layer portion 60-P, a first inorganic layer portion 81-P, an organic layer portion 82-P, a second inorganic layer portion 83-P, a first sensing insulating layer portion 91-P, a second sensing insulating layer portion 92-P, a third sensing insulating layer portion 93-P, and the overcoat layer OC covering the third sensing insulating layer portion 93-P may be disposed.

Accordingly, the light blocking layer BMI, the first to fifth insulating layers 10 to 50, the seventh insulating layer 70, the color filter CF, and the black matrix BM, which overlap the display area BA, may not overlap the transmission area BT. In such an embodiment, elements of the light emitting diode OLED-B may also not overlap the transmission area BT.

According to an embodiment, an upper surface BM-U of the black matrix BM, which is disposed adjacent to the transmission area BT, may be exposed without being covered by the color filter CF and may be in contact with the overcoat layer OC.

According to an embodiment of the disclosure, the first area A1 may have the light transmittance higher than that of the second area A2, and the light transmittance may be the highest in the transmission area BT of the first area A1, which is disposed between the first pixels EP1M.

The organic layer 82 of the thin film encapsulation layer 80 may have different thicknesses depending on its positions to compensate for a step difference of the insulating layers that are not deposited or are patterned after being deposited in the transmission area BT. In one embodiment, for example, the organic layer 82 in an area overlapping the transmission area BT may have a thickness larger than the greatest thickness of the organic layer 82 in an area overlapping the second area A2 and the display area BA.

In an embodiment, the electronic device 1000 includes the display panel 310 in which portions of the insulating layers overlapping the electronic module 400 are removed, and thus, the light transmittance of the display module 300 may be improved. Accordingly, although the electronic module 400 is disposed in the active area AA (refer to FIG. 2A), the performance of the electronic module 400 of the electronic device 1000 may be improved.

Referring to FIG. 7, the line area BL disposed between the transmission areas BT may include a light blocking layer BML-L, a first gate line G1-L, an upper electrode line UE-L, a second gate line G3-L, a first connection electrode line CNE1-L, and a second connection electrode line CNE2-L. The transmission area BT adjacent to the line area BL may have substantially the same layer structure as that of the transmission area BT adjacent to the display area BA described with reference to FIG. 6.

Hereinafter, descriptions of the components disposed above the thin film encapsulation layer 80 in FIG. 7 will be omitted, and any repetitive detailed description of the same or like components as those described above will be omitted.

The first gate line G1-L may be disposed on the first insulating layer 10 and may be covered by the second insulating layer 20. The first gate line G1-L may branch off from the first gate G1 (refer to FIGS. 5 and 6).

The upper electrode line UE-L may be disposed on the second insulating layer 20 and may be covered by the third insulating layer 30. The upper electrode line UE-L may branch off from the upper electrode EU (refer to FIGS. 5 and 6). The upper electrode line UE-L may be spaced apart from the first gate line G1-L when viewed in a cross-section.

The second gate line G3-L may be disposed on the fourth insulating layer 40 and may be covered by the fifth insulating layer 50. The second gate line G3-L may branch off from the second gate G3 (refer to FIGS. 5 and 6).

The first connection electrode line CNE1-L may be disposed on the fifth insulating layer 50 and may be covered by the sixth insulating layer 60. The first connection electrode line CNE1-L may branch off from the first connection electrode CNE1 (refer to FIGS. 5 and 6).

The second connection electrode line CNE2-L may be disposed on the sixth insulating layer 60 and may be covered by the seventh insulating layer 70. The second connection electrode line CNE2-L may branch off from the second connection electrode CNE2 (refer to FIGS. 5 and 6).

According to an embodiment, the light blocking layer BMI-L may overlap the line area BL of the first area A1. In one embodiment, for example, the light blocking layer BMI-L may be disposed between the second barrier layer BRL and the buffer layer BFL, which overlap the line area BL. Accordingly, although the display area BA and the line area BL including the conductive material surround the transmission area BT, the phenomenon in which the external light is reflected by the lines and perceived through the electronic module 400 (refer to FIG. 2A) may be prevented by the light blocking layer BMI-L. Therefore, even though the electronic module 400 is disposed in the active area AA (refer to FIG. 2A), the reliability of the electronic device 1000 may be improved.

According to an embodiment of the disclosure, the second barrier layer BRL in an area overlapping the display area BA and the line area BL may have a thickness greater than the thickness of the second barrier layer BRL in an area overlapping the transmission area BT. In such an embodiment, the second barrier layer overlapping the transmission area BT may be removed by a predetermined thickness in the process of removing the insulating layers disposed on the transmission area BT.

Figure 8:
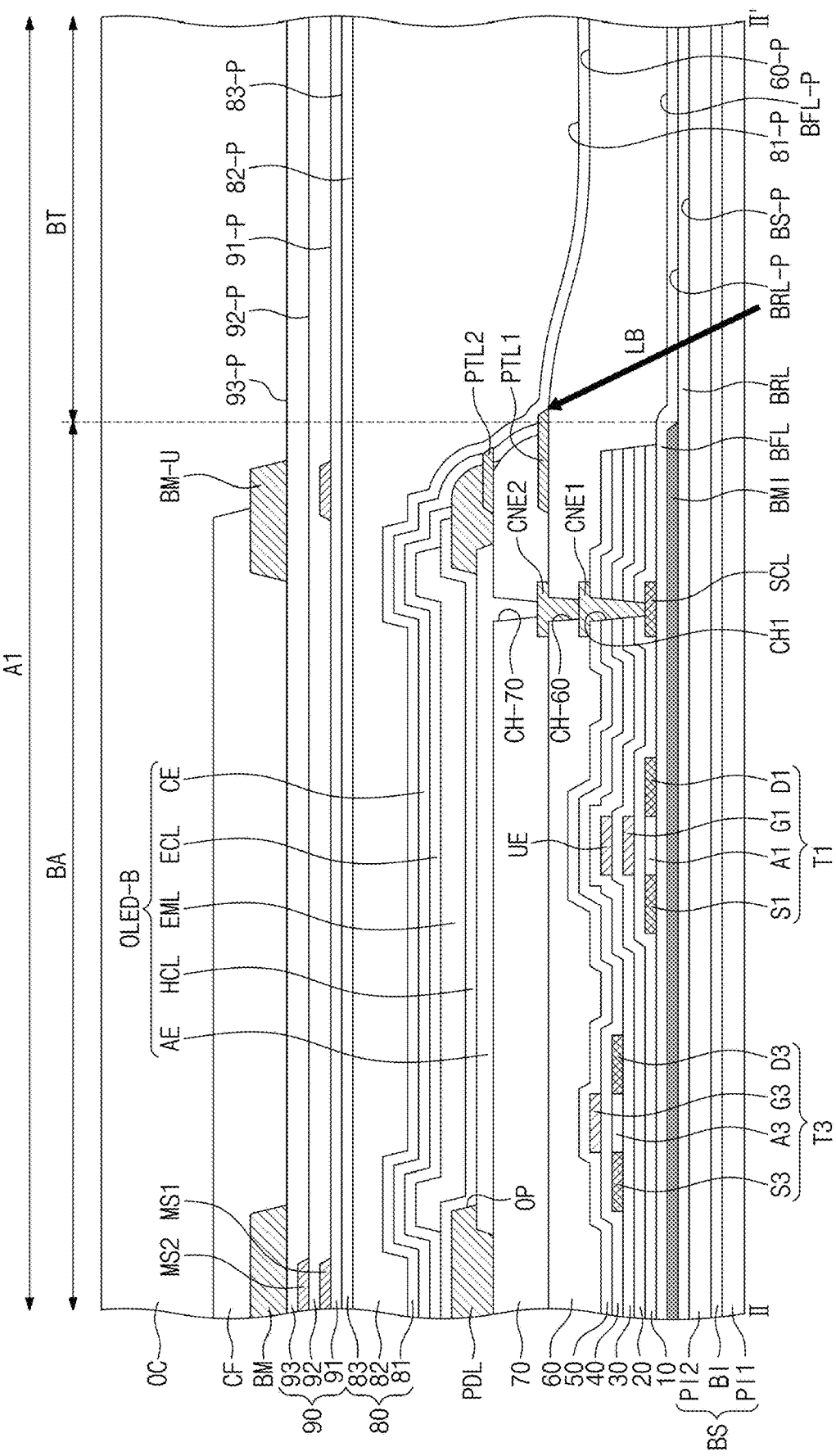
FIG. 8 is a cross-sectional view showing an active area according to an embodiment of the disclosure.
Figure 9:
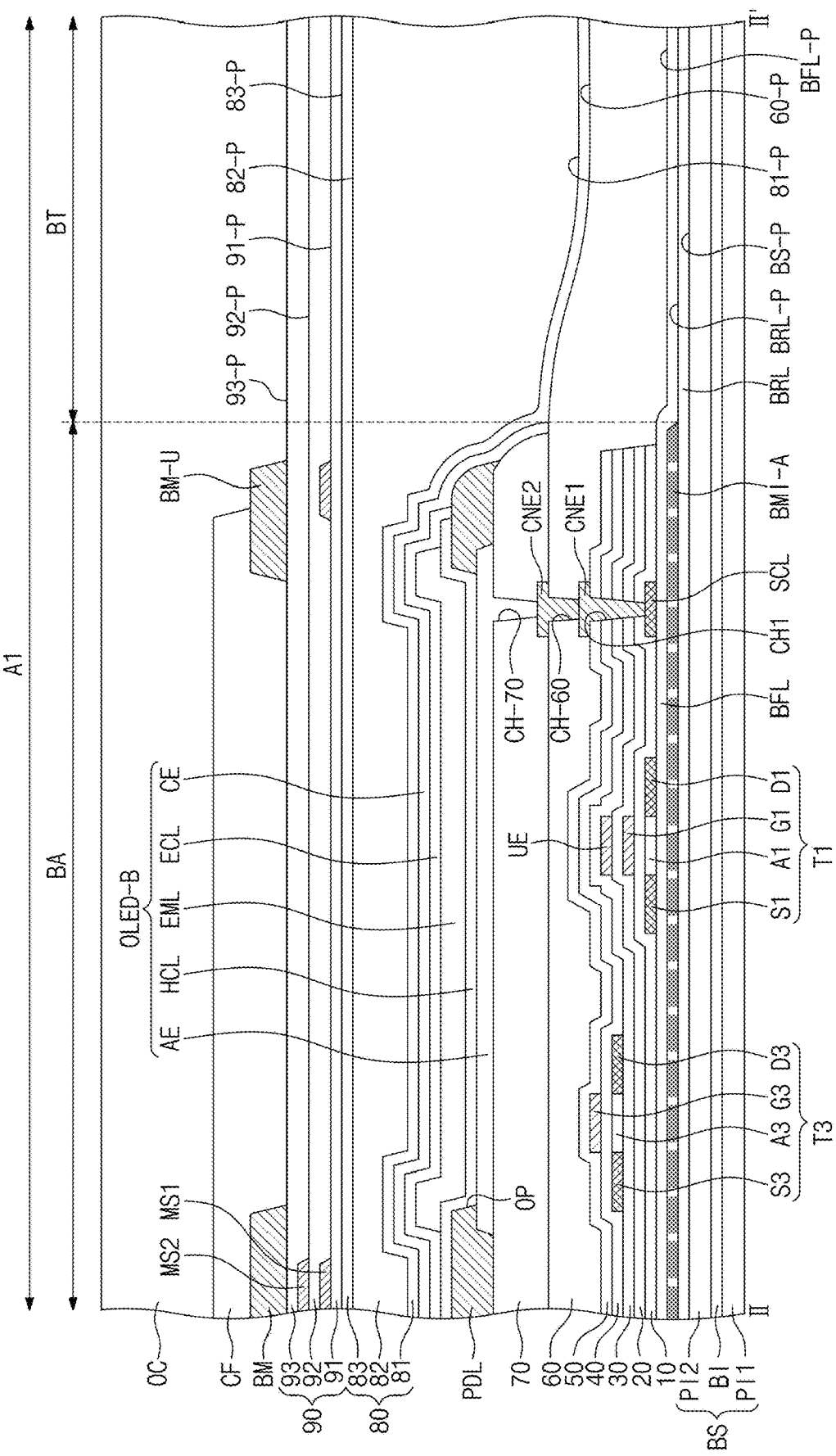
FIG. 9 is a cross-sectional view showing an active area according to an embodiment of the disclosure.

FIG. 8 is a cross-sectional view showing an active area according to an embodiment of the disclosure, and FIG. 9 is a cross-sectional view showing an active area according to an embodiment of the disclosure. In FIGS. 8 and 9, the same or like reference numerals denote the same or like elements as those described above with reference to FIGS. 1 to 7, and thus, any repetitive detailed descriptions thereof will be omitted.

Referring to FIG. 8, the display panel 310 (refer to FIG. 2B) may include protective patterns PTL1 and PTL2. The protective patterns PTL1 and PTL2 may be functional patterns that protect elements overlapping the transmission area BT among elements entirely deposited or coated on the first area A1 and the second area A2 from being damaged while the elements overlapping the transmission area BT are removed by a laser beam LB.

The protective patterns PTL1 and PTL2 may be disposed in the display area BA of the first area A1 and may be disposed adjacent to the transmission area BT. The protective patterns PTL1 and PTL2 may be disposed in the display area BA and may surround a border of the transmission area BT.

A first protective pattern PTL1 may be disposed on the sixth insulating layer 60. The first protective pattern PTL1 may include a same material as that of the second connection electrode CNE2 and may be substantially simultaneously patterned with the second connection electrode CNE2.

A second protective pattern PTL2 may be disposed on the seventh insulating layer 70. The second protective pattern PTL2 may include a same material as that of the first electrode AE and may be substantially simultaneously patterned with the first electrode AE.

According to an embodiment, when the laser beam LB is provided to the transmission area BT to remove the elements overlapping the transmission area BT, e.g., the second electrode CE (refer to FIG. 6), the elements disposed adjacent to the transmission area BT may be prevented from being delaminated due to the laser beam LB. Accordingly, the reliability of the display module may be improved.

Referring to FIG. 9, in an embodiment, a light blocking layer BMI-A may have a patterned shape. In one embodiment, for example, the light blocking layer BMI-A may be disposed between the second barrier layer BRL and the buffer layer BFL in the display area BA of the first area A1.

The light blocking layer BMI-A may be provided with a plurality of holes defined therethrough to expose at least a portion of the second barrier layer BRL. The buffer layer BFL may be easily coupled to the second barrier layer BRL via the holes.

Figure 10:
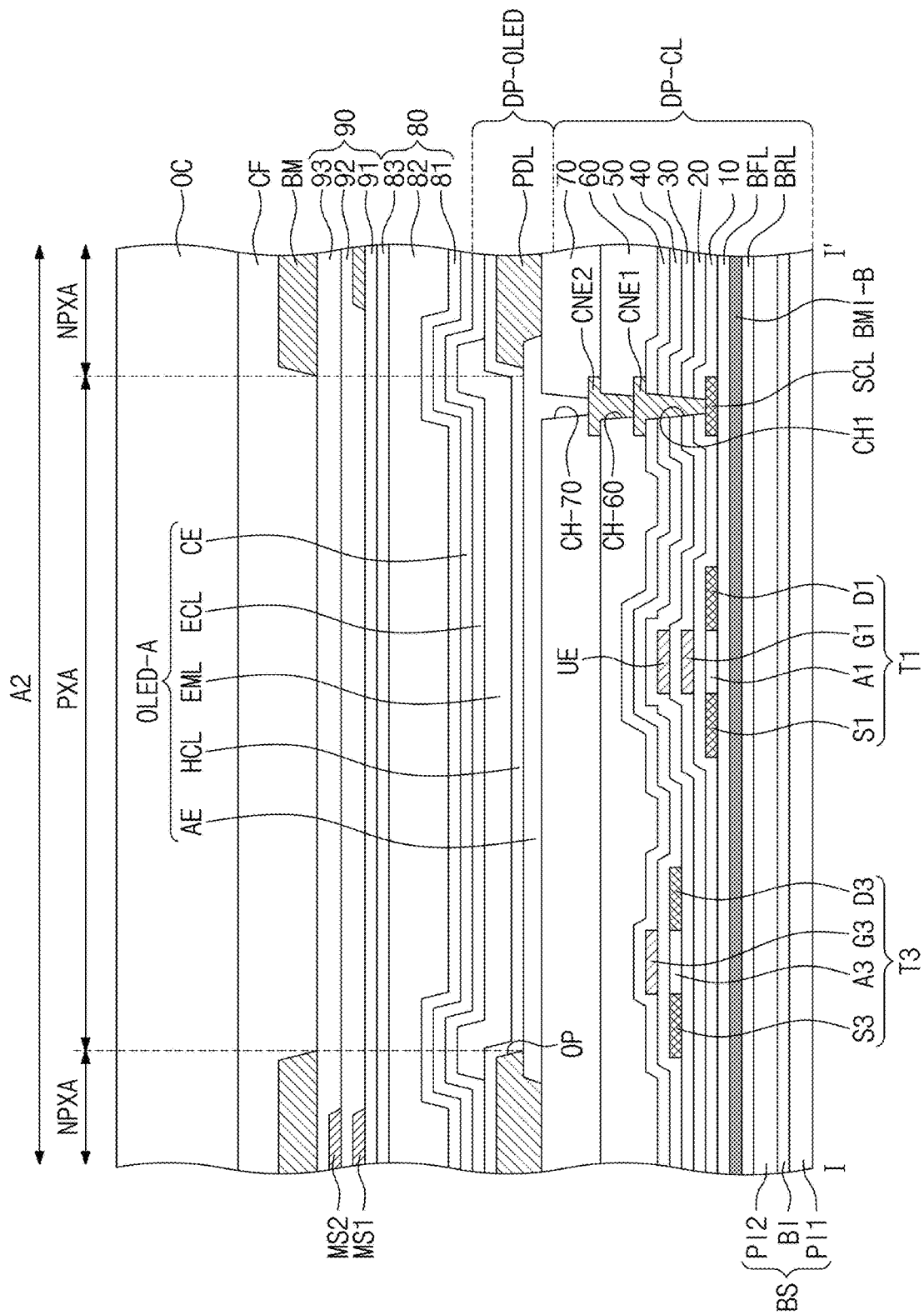
FIG. 10 is a cross-sectional view showing an active area according to an embodiment of the disclosure.

FIG. 10 is a cross-sectional view showing an active area according to an embodiment of the disclosure. FIG. 10 shows the cross-sectional view corresponding to FIG. 5. In FIG. 10, the same or like reference numerals denote the same or like elements as those described above with reference to FIGS. 1 to 5, and thus, any repetitive detailed descriptions thereof will be omitted.

According to an embodiment, the circuit element layer DP-CL may further include an additional light blocking layer BMI-B disposed in an area of the display panel 310 (refer to FIG. 2B), which overlaps the second area A2. The additional light blocking layer BMI-B may be disposed between the second barrier layer BRL and the buffer layer BFL, but not being limited thereto or thereby. According to an embodiment, the light blocking layer BMI described with reference to FIG. 6 and the additional light blocking layer BMI-B may be disposed in different layers from each other.

In one embodiment, for example, the additional light blocking layer BMI-B may be disposed on the buffer layer BFL, and an insulating layer including silicon oxide may be further disposed between the light blocking layer BMI and the additional light blocking layer BMI-B. Accordingly, the light blocking layer BMI may be disposed at a position lower than that of the additional light blocking layer BMI-B.

According to AN embodiment, the additional light blocking layer BMI-B may have a thickness of about 1000 angstroms (Å), and the light blocking layer BMI may have a thickness of about 2500 angstroms (Å). In an embodiment, the additional light blocking layer BMI-B and the light blocking layer BMI may include molybdenum (Mo).

In such an embodiment where the additional light blocking layer BMI-B is disposed under the driving transistor T1, deterioration of the residual-voltage characteristic of the first semiconductor pattern by external light may be effectively prevented. Thus, the reliability of the display panel may be improved.

Figure 11:
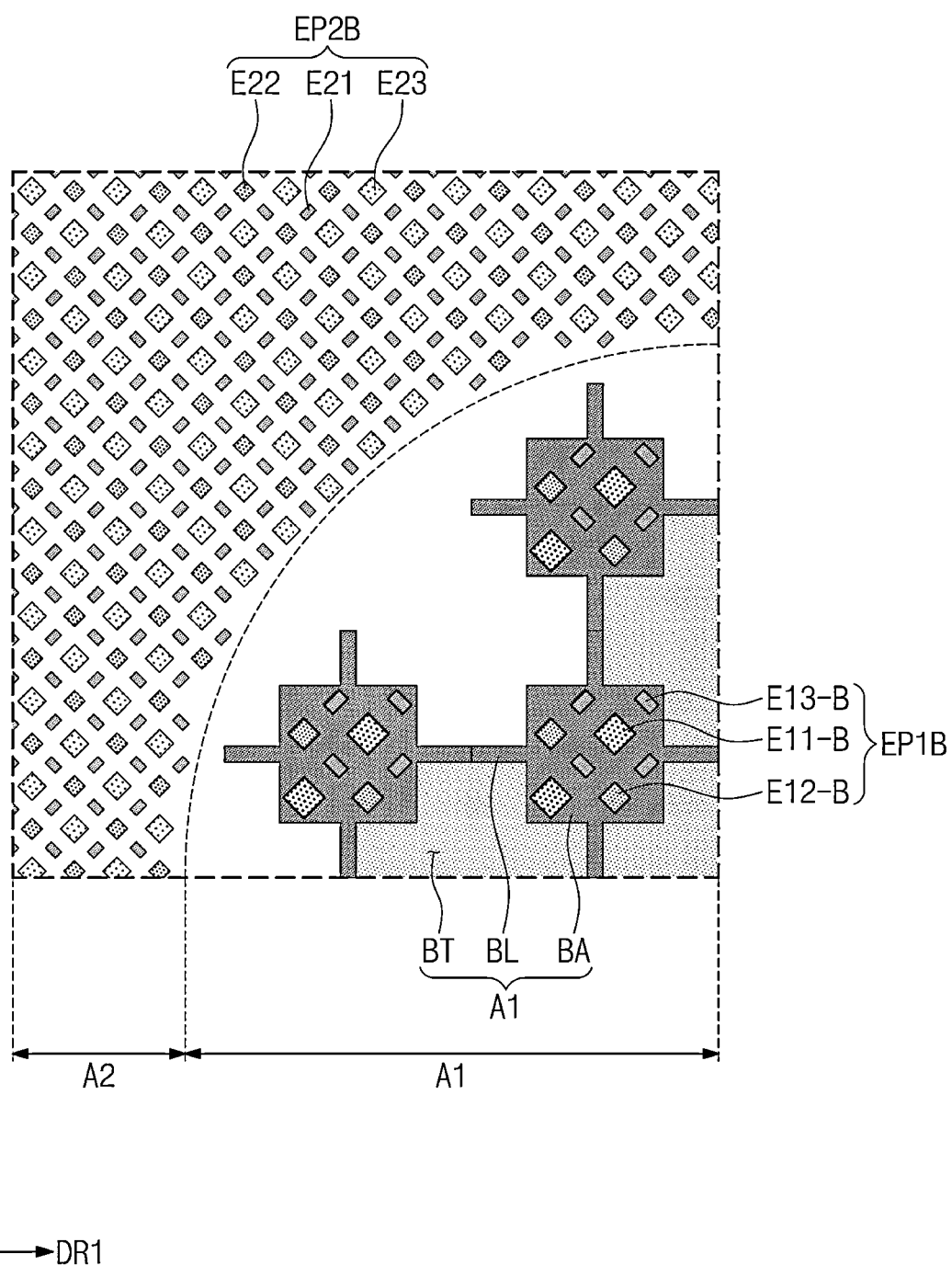
FIG. 11 is a cross-sectional view showing an active area according to an embodiment of the disclosure.
Figure 12:
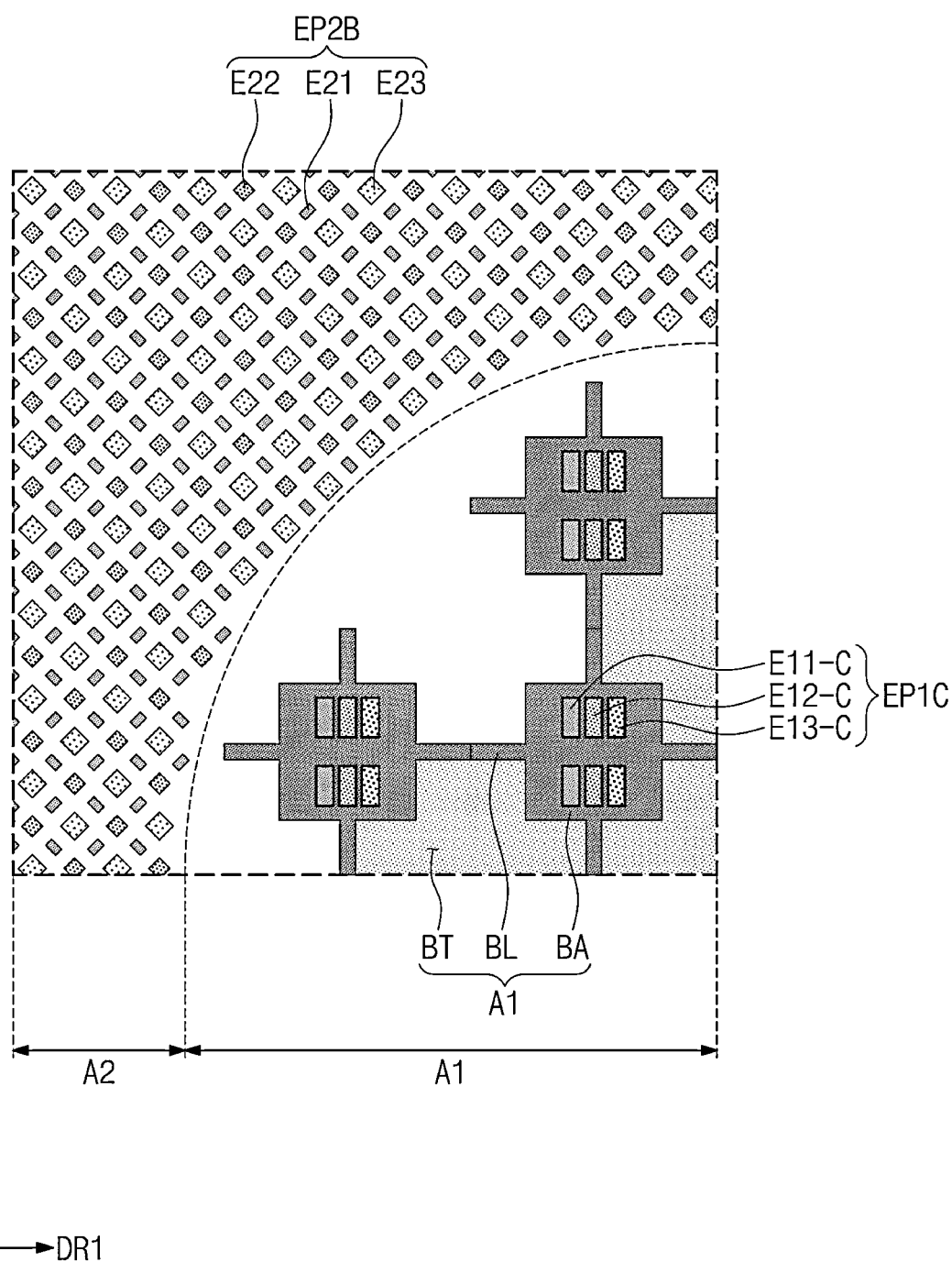
FIG. 12 is a cross-sectional view showing an active area according to an embodiment of the disclosure.

FIG. 11 is a cross-sectional view showing an active area according to an embodiment of the disclosure, and FIG. 12 is a cross-sectional view showing an active area according to an embodiment of the disclosure. In FIGS. 11 and 12, the same or like reference numerals denote the same or like elements as those described above with reference to FIGS. 1 to 7, and thus, any repetitive detailed descriptions thereof will be omitted.

In such an embodiment, a first area A1 and a second area A2 of FIGS. 11 and 12 may be substantially the same as the first area A1 and the second area A2 of FIGS. 1 to 7. Accordingly, the first area A1 may be defined as an area having a relatively higher light transmittance than that of the second area A2.

The first area A1 may include a display area BA and a line area BL surrounding a transmission area BT and the transmission area BT. The display area BA and the line area BL in which the light blocking layers BMI and BMI-L described with reference to FIGS. 6 and 7 are disposed are illustrated in a relatively dark color compared with the transmission area BT.

In an embodiment, as shown in FIG. 11, a first pixel EP1B may have a relatively larger light emitting area than that of a second pixel EP2B. In such an embodiment, the transmission area BT may be defined as an area surrounded by the display area BA and the line area BL. Each of the first sub-pixels E11-B, E12-B, and E13-B of the first pixel EP1B may have relatively larger areas than a corresponding one of the second sub-pixels E21, E22, and E23 of the second pixel EP2B. In an embodiment, distances between the first sub-pixels E11-B, E12-B, and E13-B of the first pixel EP1B may be greater than distances between the second sub-pixels E21, E22, and E23 of the second pixel EP2B.

FIG. 11 shows an embodiment having a structure in which eight sub-pixels are arranged in one display area BA, but the number of the sub-pixels arranged in one display area BA is not particularly limited as long as the sub-pixels of the first pixel EP1B have the larger area than that of the sub-pixels of the second pixel EP2B.

In an embodiment, as shown in FIG. 12, a first pixel EP1C may have an arrangement different from that of a second pixel EP2C. In an embodiment, a transmission area BT may be defined as an area surrounded by a display area BA and a line area BL. First sub-pixels E11-C, E12-C, and E13-C of the first pixel EP1C may be arranged in a stripe shape substantially parallel to each of the first direction DR1 and the second direction DR2, and second sub-pixels E21, E22, and E23 of the second pixel EP2C may be arranged in a direction inclined with respect to the first direction DR1 and the second direction DR2. Accordingly, a distance between the pixels EP1C in the first area A1 may increase, and thus, the light transmittance of the first area A1 may increase.

According to an embodiment, as the pixels of the first area A1 are arranged with a density smaller than that of the pixels in the second area A2 and the transmission area BT is defined in the first area A1, the first area A1 may be designed to have the high light transmittance.

FIG. 12 shows an embodiment having a structure in which six sub-pixels are arranged in one display area BA, but the number of the sub-pixels arranged in one display area BA is not particularly limited as long as the sub-pixels of the first pixel EP1C have a different arrangement from that of the sub-pixels of the second pixel EP2C and are arranged with the density smaller than the sub-pixels of the second pixel EP2C.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. An electronic device comprising:
   a display panel in which a first area including a display area, a line area and a transmission area, and a second area adjacent to the first area are defined, wherein the display panel comprises a base layer, a barrier layer disposed on the base layer, a light blocking layer disposed on the barrier layer, an additional light blocking layer disposed in the second area a plurality of insulating layers disposed on the base layer, a first pixel disposed in the first area, and a second pixel disposed in the second area; and an input sensor disposed on the display panel, wherein the input sensor comprises sensing insulating layers, wherein the first area has a higher light transmittance than the second area, the light blocking layer overlaps the display area and the line area, and the light blocking layer does not overlap the transmission area.

2. The electronic device of claim 1, wherein the transmission area is surrounded by the display area and the line area when viewed in a plan view.

3. The electronic device of claim 1, wherein the display panel comprises:
a circuit element layer comprising the base layer, the barrier layer, the light blocking layer, a buffer layer disposed on the barrier layer, the insulating layers, and transistors disposed between the insulating layers;
a display element layer comprising a light emitting diode comprising a first electrode connected to the transistors, a second electrode and a light emitting layer disposed between the first electrode and the second electrode, and a pixel definition layer provided with an opening defined therethrough to expose at least a portion of the first electrode; and
a thin film encapsulation layer covering the display element layer, wherein the thin film encapsulation layer comprises a first inorganic layer, a second inorganic layer, and an organic layer disposed between the first inorganic layer and the second inorganic layer.

4. The electronic device of claim 3, wherein
the insulating layers comprise first, second, third, fourth, fifth, sixth, and seventh insulating layers,
one transistor among the transistors comprises:
a first semiconductor pattern disposed on the buffer layer, and covered by the first insulating layer, wherein the first semiconductor pattern comprises a first active comprising a polysilicon;
a first gate disposed on the first insulating layer, covered by the second insulating layer, and overlapping the first active; and
an upper electrode disposed on the second insulating layer, covered by the third insulating layer, and overlapping the first gate, and
another transistor among the first to seventh transistors comprises:
a second semiconductor pattern disposed on the third insulating layer, and covered by the fourth insulating layer, wherein the second semiconductor pattern comprises a second active comprising a metal oxide; and
a second gate disposed on the fourth insulating layer, covered by the fifth insulating layer, and overlapping the second active.

5. The electronic device of claim 4, further comprising:
a first connection electrode disposed on the fifth insulating layer, covered by the sixth insulating layer, and connected to the transistors via a first contact hole defined through the first to fifth insulating layers; and
a second connection electrode disposed on the sixth insulating layer, covered by the seventh insulating layer, and connecting the first electrode to the first connection electrode via a second contact hole defined through the sixth insulating layer.

6. The electronic device of claim 5, wherein the line area comprises:
a first gate line disposed on the first insulating layer and branching off from the first gate;
an upper electrode line disposed on the second insulating layer and branching off from the upper electrode;
a second gate line disposed on the fourth insulating layer and branching off from the second gate;
a first connection electrode line disposed on the fifth insulating layer and branching off from the first connection electrode; and
a second connection electrode line disposed on the sixth insulating layer and branching off from the second connection electrode.

7. The electronic device of claim 6, wherein the transmission area overlaps the base layer, the barrier layer, the buffer layer, the sixth insulating layer, the first inorganic layer, the organic layer and the second inorganic layer.

8. The electronic device of claim 5, further comprising:
a protective pattern adjacent to the transmission area of the display area, and disposed on at least one selected from the sixth insulating layer and the seventh insulating layer, wherein the protective pattern comprises a metal.

9. The electronic device of claim 3, further comprising:
a black matrix overlapping the pixel definition layer and disposed on the input sensor;
a color filter overlapping the light emitting layer; and
an overcoat layer covering the color filter.

10. The electronic device of claim 9, wherein the sensing insulating layers overlap the first area and the second area.

11. The electronic device of claim 10, wherein a portion of an upper surface of the black matrix, which is adjacent to the transmission area, is covered by the overcoat layer.

12. The electronic device of claim 9, wherein a portion of the overcoat layer, which overlaps the transmission area, is in contact with one of the sensing insulating layers.

13. The electronic device of claim 3, wherein the pixel definition layer has a black color.

14. The electronic device of claim 1, wherein the light blocking layer is provided with a plurality of holes defined therethrough to expose a portion of the barrier layer.

15. The electronic device of claim 1, wherein
each of the first pixel and the second pixel comprises a plurality of sub-pixels which emits lights having first, second, and third colors, respectively, and
an arrangement of the sub-pixels of the first pixel is different from an arrangement of the sub-pixels of the second pixel.

16. The electronic device of claim 1, wherein
each of the first pixel and the second pixel comprises a plurality of sub-pixels which emits lights having first, second, and third colors, respectively, and
an area of the sub-pixels of a same color is greater in the first pixel than in the second pixel.

17. The electronic device of claim 1, wherein the transmission area is surrounded by the line area and the display area.

18. The electronic device of claim 17, wherein the transmission area has a cross shape.

19. The electronic device of claim 1, further comprising:
an electronic module overlapping the first area and disposed under the display panel,
wherein the electronic module comprises at least one selected from an audio output module, a light emitting module, a light receiving module, and a camera module.

* * * * *